US006396198B1

(12) United States Patent
Okimura et al.

(10) Patent No.: US 6,396,198 B1
(45) Date of Patent: May 28, 2002

(54) WAVE TRANSMISSION-RECEPTION ELEMENT FOR USE IN ULTRASOUND PROBE, METHOD FOR MANUFACTURING THE WAVE TRANSMISSION-RECEPTION ELEMENT AND ULTRASOUND PROBE INCORPORATING THE TRANSMISSION-RECEPTION ELEMENT

(75) Inventors: Yasuyuki Okimura, Inuyama; Kazushige Ohbayashi, Nagoya, both of (JP)

(73) Assignee: NGK Spark Plug Co. Ltd., Aichi (JP)

( * ) Notice: Subject to any disclaimer, the term of this patent is extended or adjusted under 35 U.S.C. 154(b) by 0 days.

(21) Appl. No.: 09/593,225

(22) Filed: Jun. 14, 2000

(30) Foreign Application Priority Data

Jun. 16, 1999 (JP) .......................................... 11-169757

(51) Int. Cl.7 ................................................ H01L 41/08
(52) U.S. Cl. ....................................... 310/334; 310/327
(58) Field of Search ................................ 310/334, 326, 310/327

(56) References Cited

U.S. PATENT DOCUMENTS 4,326,274 A * 4/1982 Hotta et al. ................. 310/326
4,686,409 A * 8/1987 Kaarmann et al. .......... 310/334
4,755,707 A * 7/1988 Nakaya et al. .............. 310/334
4,801,835 A * 1/1989 Nakaya et al. .............. 310/334
4,917,097 A 4/1990 Proudian et al. ....... 128/662.06
5,327,895 A * 7/1994 Hashimoto et al. ......... 310/334
5,376,859 A * 12/1994 Kim et al. .................. 310/334
5,603,327 A 2/1997 Eberle et al. .......... 128/662.06
5,869,767 A * 2/1999 Hayard et al. .............. 310/334
6,024,703 A * 2/2000 Zanelli et al. .............. 600/437
6,049,159 A * 4/2000 Barthe et al. ............... 310/334

FOREIGN PATENT DOCUMENTS

JP 2063443 A 3/1990 ............ A61B/8/00
JP 2-200099 A * 8/1990 ................. 310/334
JP 5244691 A 9/1993 ........... H04R/17/00

* cited by examiner

*Primary Examiner*—Thomas M. Dougherty
(74) *Attorney, Agent, or Firm*—Brinks Hofer Gilson & Lione

(57) ABSTRACT

A wave transmission-reception element for use in an ultrasound probe includes a base member and a plurality of unit vibration elements embedded in the base member. Each of the unit vibration elements includes a piezoelectric ceramic piece having a front face and a back face and polarized in a direction extending between the front and back faces, a front electrode formed on the front face, and a back electrode formed on the back face. Thus, the unit vibration elements are uniformly held in place without involvement of an increase in the thickness of the wave transmission-reception element, so that the wave transmission-reception element can be miniaturized, and the angle of beam spread can be increased. The invention includes a method for manufacturing the wave transmission-reception element as well as an ultrasound probe incorporating the wave transmission-reception element.

9 Claims, 20 Drawing Sheets

WAVE TRANSMISSION-RECEPTION ELEMENT FOR USE IN ULTRASOUND PROBE, METHOD FOR MANUFACTURING THE WAVE TRANSMISSION-RECEPTION ELEMENT AND ULTRASOUND PROBE INCORPORATING THE TRANSMISSION-RECEPTION ELEMENT

BACKGROUND OF THE INVENTION

1. Field of the Invention

The present invention relates to a wave transmission-reception element for use in an ultrasound probe, a method of manufacturing the element and an ultrasound probe incorporating the element to be inserted into, for example, a blood vessel for ultrasound diagnosis.

2. Description of Related Art

Ultrasound diagnosis, particularly ultrasonogram information, is essential in every field of present-day clinical medicine. For example, in examination of the interior of a blood vessel for an anomaly, such as arterial sclerosis, which is a serious disease derived from a clot resulting from accumulation of cholesterol, direct observation from inside a blood vessel can be expected to yield higher-resolution, more effective imaging than can observation from outside a blood vessel. In this case, since a blood vessel is full of blood, imaging cannot be performed by optical means. In such a case, ultrasound imaging is an effective means for visualization. In ultrasound imaging, an ultrasound probe is inserted into a blood vessel so as to enable visualization of the interior of the blood vessel for diagnosis.

In most conventional methods, an ultrasound beam is transmitted in a radial direction of a blood vessel to thereby obtain a two-dimensional image (as disclosed in, for example, U.S. Pat. Nos. 4,917,097 and 5,603,327 and Japanese Patent Application Laid-Open (kokai) No. 152800/1992). From the viewpoint of medical practice, obtaining a three-dimensional image in real time is preferred. According to a proposed method for obtaining a three-dimensional image, a plurality of piezoelectric elements are arranged in a circle at an end of a probe. One of the elements transmits spherical waves forward, and the remaining elements receive reflections of the spherical waves. The elements sequentially take turns transmitting spherical waves to thereby obtain a three-dimensional image.

In order to obtain a three-dimensional image, this method employs a probe capable of transmitting spherical waves forward. A plurality of fine elements formed from a piezoelectric material are arranged at an end of the probe in order to transmit/receive ultrasound waves.

A practically available material for such an element is a piezoelectric polymer, such as PVDF (polyvinylidene fluoride), which permits fine processing. However, from the viewpoint of sensitivity, piezoelectric ceramic, which has a higher electromechanical coupling coefficient, is preferred as material for the element. Thus, piezoelectric ceramic, such as PT (lead titanate) or PZT (lead zirconate titanate), is used as material for the element. An electrode is formed on each of the front and back faces of an annular piezoelectric ceramic piece. The annular piezoelectric ceramic piece is divided into a plurality of divisions by means of a dicing saw to thereby form a plurality of unit vibration elements, which constitute an ultrasound probe.

According to the above-mentioned method, the annular piezoelectric ceramic piece is divided into elements x serving as unit vibration elements. From the viewpoint of manufacture of elements, the method has an advantage in that a piezoelectric ceramic piece of relatively large size may be formed by a conventional method, since unit vibration elements of small size can be formed through cutting of the piezoelectric ceramic piece as mentioned above. However, as shown in FIG. 22, each element x has a complex shape, such as a portion of a sector. Thus, angle θ of beam spread becomes small. Further, a spherical wave cannot be obtained, and a visualization range A becomes distant and narrow. Since the unit vibration elements are of a complex shape, their vibration modes become complicated, causing difficulty in signal processing. In this case, each of the piezoelectric elements may conceivably be formed into a circular shape. However, since the angle of beam spread as measured in a far sound field is reciprocal to the diameter of a sound source, in order to increase the angle of beam spread, a very fine element must be manufactured. A conventional method for manufacturing a piezoelectric ceramic piece encounters great difficulty in manufacturing a fine element applicable to ultrasound diagnosis effected from inside a blood vessel.

An object of the present invention is to provide a wave transmission-reception element for use in an ultrasound probe capable of solving the above problems, a method for manufacturing the wave transmission-reception element, and a probe incorporating the wave transmission-reception element.

BRIEF SUMMARY OF THE INVENTION

The present invention provides a wave transmission-reception element for use in an ultrasound probe, comprising a base member and a plurality of unit vibration elements embedded in the base member. Each of the unit vibration elements comprises a piezoelectric ceramic piece polarized in a direction extending between its front and back faces, a front electrode formed on the front face of the piezoelectric ceramic piece, and a back electrode formed on the back face of the piezoelectric ceramic piece.

The piezoelectric ceramic piece may assume any of various forms, such as a short cylinder or a quadrangular prism. In the case of a form having a noncircular end face, such as a quadrangular prism, partial electrodes formed on the front and back faces may assume circular shapes so as to produce directivity characteristics substantially similar to those of a cylindrical piezoelectric ceramic piece.

The form of an end face of the piezoelectric ceramic piece is not limited to planar, but may be spherical so as to produce an action of a convex or concave lens. Employment of a spherical end face changes directivity accordingly.

The unit vibration elements having the thus-improved angle-of-beamspread characteristics may be arranged, for example, in a circle and may be operated such that one unit vibration element transmits spherical waves forward while the remaining vibration unit elements receive reflections of the spherical waves and such that the unit vibration elements sequentially take turns transmitting spherical waves to thereby create a three-dimensional image.

Preferably, the plurality of unit vibration elements are embedded in the base member such that each of the electrodes is exposed at the front or back face of the base member. Also, a portion of the base member may serve as an acoustic matching portion or a backing portion.

Specifically, the base member in which the plurality of unit vibration elements are embedded is formed of a member capable of matching the acoustic impedance of a medium, such as blood, within which detection is to be performed; the base member thickly covers the front electrodes of the unit vibration elements so as to form a thick cover portion; and the thick cover portion of the base member serves as an acoustic matching portion. This structure does not require employment of an acoustic matching layer in manufacture of an ultrasound probe from the wave transmission-reception element. The base member may be formed of, for example, an epoxy resin.

Preferably, the plurality of unit vibration elements are embedded in the base member capable of blocking transmission of incident sound waves; the base member thickly covers the back electrodes of the unit vibration elements so as to form a thick cover portion; and the thick cover portion of the base member serves as a backing portion. This structure does not require employment of a backing layer in manufacture of an ultrasound probe by use of the wave transmission-reception element. The base member may be, for example, a mixture of a resin material, such as epoxy resin, fluororesin, or silicone resin; aggregate; and a metallic powder, so as to be able to eliminate incident sound waves through conversion to thermal energy.

Preferably, the front or back electrodes are integrated into a common electrode covering all of the exposed faces of the piezoelectric ceramic pieces, and the common electrode serves a grounding electrode. Employment of the common electrode facilitates formation of the electrode. Alternatively, an independent electrode may be formed on each of the front and back faces of the piezoelectric ceramic pieces. A face on which the grounding electrode is formed may serve as a wave transmission-reception face.

In the above structure, only a certain portion of the unit vibration element has piezoelectric properties. The angle of beam spread and other characteristics depend on the form of an end face of the unit vibration element.

A preferred method for manufacturing a wave transmission-reception element for use in an ultrasound probe and having the above structure comprises the steps of:

(1) forming a piezoelectric ceramic material into a sheet, blanking out blanks from the sheet by use of a die, and firing the blanks to thereby yield piezoelectric ceramic pieces, each having front and back faces;

(2) arranging a plurality of piezoelectric ceramic pieces in place in a die, pouring into the die a material for a base member serving as an acoustic matching portion, and hardening the material in order to obtain the base member in which the piezoelectric ceramic pieces are embedded; and (3) polishing opposite faces of the base member so as to expose the front and back faces of the piezoelectric ceramic pieces, forming electrodes on the exposed faces of the piezoelectric ceramic pieces on one face of the base member, forming electrodes on exposed faces of the piezoelectric ceramic pieces or forming a common electrode on all of the exposed faces of the piezoelectric ceramic pieces on the other face of the base member, and polarizing the piezoelectric ceramic pieces so as to form unit vibration elements.

According to the above method, the unit vibration elements are integrally held in place in the base member. Through polishing of the base member, the wave transmission-reception element is formed to assume a predetermined thickness. The base member is preferably formed of cold-setting epoxy resin. Notably, the base member may be formed of cement.

According to the above method, after the piezoelectric ceramic pieces are embedded in the base member, formation of electrodes and polarization are performed to thereby yield the wave transmission-reception element. However, the above method may be modified such that the piezoelectric ceramic pieces are individually polished and then subjected to formation of electrodes and polarization, followed by embedment in the base member to thereby yield the wave transmission-reception element.

Alternatively, after the piezoelectric ceramic pieces are individually subjected to formation of electrodes and polarization and are then embedded in the base member, the resultant assembly may be polished at its front and back faces and may again be subjected to formation of electrodes, thus yielding the wave transmission-reception element.

Another method for manufacturing a wave transmission-reception element for use in an ultrasound probe and having an acoustic matching portion comprises the steps of:

(1) forming a piezoelectric ceramic material into a sheet, blanking out blanks from the sheet by use of a die, and firing the blanks to thereby yield piezoelectric ceramic pieces, each having front and back faces;

(2) forming electrodes on the front faces of the piezoelectric ceramic pieces so as to form front electrodes, and connecting lead wires to the corresponding front electrodes (3) arranging a plurality of piezoelectric ceramic pieces in place in a die, pouring into the die a material for a base member serving as an acoustic matching portion in such a manner as to thickly cover the front electrodes connected to the lead wires, thereby forming a thick cover portion serving as the acoustic matching portion, and hardening the material in order to obtain the base member in which the piezoelectric ceramic pieces are embedded and from which the lead wires are led out; and (4) polishing the back face of the base member so as to expose the back faces of the piezoelectric ceramic pieces, forming electrodes on the back faces of the piezoelectric ceramic pieces, and polarizing the resultant piezoelectric ceramic pieces to thereby yield unit vibration elements.

According to the above method, after the piezoelectric ceramic elements are embedded in the base member, formation of back electrodes and polarization are performed to thereby yield the wave transmission-reception element. However, the above method may be modified such that the piezoelectric ceramic pieces are individually polished and then subjected to formation of electrodes and polarization; lead wires are connected to the corresponding front electrodes of the piezoelectric ceramic pieces; and the resultant piezoelectric ceramic pieces are embedded in the base member while the lead wires are led out, thereby yielding the wave transmission-reception element.

Alternatively, the piezoelectric ceramic pieces are individually subjected to formation of electrodes and polarization; lead wires are connected to the corresponding front electrodes of the piezoelectric ceramic pieces; the resultant piezoelectric ceramic pieces are embedded in the base member while the lead wires are led out; the back face of the resultant assembly is polished; and the back electrodes are again formed to thereby yield the wave transmission-reception element.

A third method for manufacturing a wave transmission-reception element for use in an ultrasound probe and having a backing portion comprises the steps of:

(1) forming a piezoelectric ceramic material into a sheet, blanking out blanks from the sheet by use of a die, and firing the blanks to thereby yield piezoelectric ceramic pieces, each having front and back faces;

(2) forming electrodes on the back faces of the piezoelectric ceramic pieces so as to form back electrodes, and connecting lead wires to the corresponding back electrodes;

(3) arranging a plurality of piezoelectric ceramic pieces in place in a die, pouring into the die a material for a base member serving as a backing material in such a manner as to thickly cover the back electrodes connected to the lead wires, thereby forming a thick cover portion serving as a backing portion, and hardening the material in order to obtain the base member in which the piezoelectric ceramic pieces are embedded and from which the lead wires are led out; and (4) polishing the front face of the base member so as to expose the front faces of the piezoelectric ceramic pieces, forming electrodes on the front faces of the piezoelectric ceramic pieces, and polarizing the resultant piezoelectric ceramic pieces to thereby yield unit vibration elements.

According to the above method, after the piezoelectric ceramic elements are embedded in the base member, formation of front electrodes and polarization are performed to thereby yield the wave transmission-reception element. However, the above method may be modified such that the piezoelectric ceramic pieces are individually polished and then subjected to formation of electrodes and polarization; lead wires are be connected to the corresponding back electrodes of the piezoelectric ceramic pieces; and the resultant piezoelectric ceramic pieces are embedded in the base member while the lead wires are led out, thereby yielding the wave transmission-reception element.

Alternatively, the piezoelectric ceramic pieces are individually subjected to formation of electrodes and polarization; lead wires are connected to the corresponding back electrodes of the piezoelectric ceramic pieces; the resultant piezoelectric ceramic pieces are embedded in the base member while the lead wires are led out; the front face of the resultant assembly is polished; and the front electrodes are again formed to thereby yield the wave transmission-reception element.

An acoustic matching layer may be bonded to the wave transmission-reception face of the above-described transmission-reception element, while a backing layer may be bonded to the back face of the wave transmission-reception element, thereby yielding an optimum ultrasound probe. In the case of the wave transmission-reception element having an acoustic matching portion, solely a backing layer may be bonded to its back face. In the case of the wave transmission-reception element having a backing portion, solely the acoustic matching layer may be bonded to its front face.

Since the above-described wave transmission-reception element has fine, circular unit vibration elements, an ultrasound probe using the wave transmission-reception element can transmit forward spherical waves, each having a large angle of beam spread. Thus, when used for examination of, for example, the interior of a blood vessel, the ultrasound probe can produce a three-dimensional image of the interior of the blood vessel in real time. In contrast to conventional practice in which a doctor mentally visualizes a three-dimensional image from obtained two-dimensional images, the ultrasound probe of the present invention enables creation of a three-dimensional image, thereby improving accuracy of ultrasound diagnosis.

A through-hole may be formed at the center of the wave transmission-reception element described above so as to serve as a laser beam path. An ultrasound probe using the wave transmission-reception element can locate, for example, a clot in a blood vessel and can destroy it through emission of a laser beam.

DESCRIPTION OF THE PREFERRED AND ALTERNATE EMBODIMENTS

Figure 1:
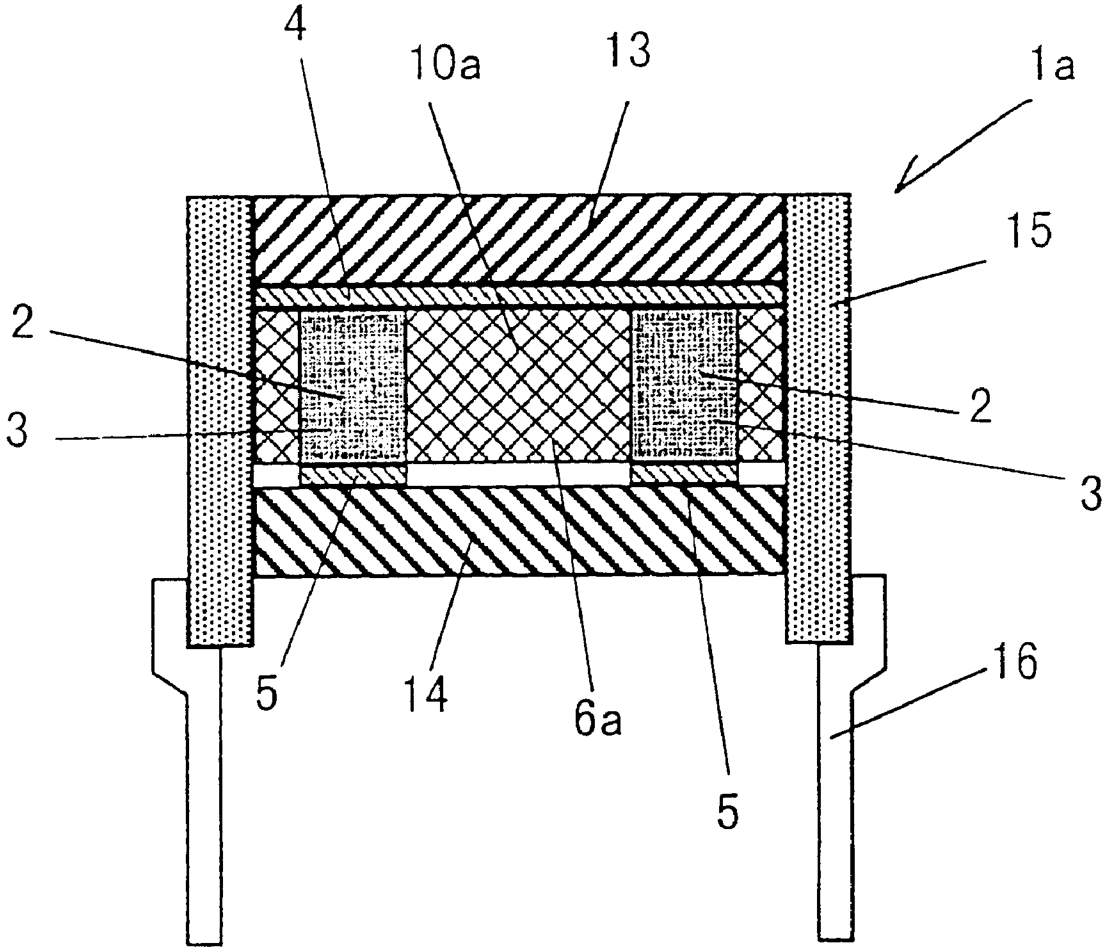
FIG. 1 is a cross-sectional view of a first ultrasound probe equipped with a wave transmission-reception element according to a preferred embodiment of the present invention.

FIG. 1 shows a first ultrasound probe 1*a* according to the present invention.

The ultrasound probe 1*a* includes a preferred embodiment of a wave transmission-reception element 10*a*, which carries a plurality of unit vibration elements 2 arranged in a circumferential direction. An acoustic matching layer 13 is disposed on the wave transmission-reception face of the wave transmission-reception element 10*a*, whereas a backing layer 14 is disposed on the back face of the wave transmission-reception element 10*a*. To the resultant laminate, a short tubular casing 15 is fitted. A flexible tube 16, such as a rubber tube, is fitted to the casing 15.

In order for sound waves to propagate straight, the acoustic matching layer 13 is formed from material which matches the acoustic impedance of a medium, such as blood, within which detection is to be performed. Examples of such material include epoxy resin and silicone resin. The backing layer 14 is adapted to prevent sound waves from being radiated backward of the unit vibration elements 2. The backing layer 14 is formed from a mixture of a resin material, such as epoxy resin, fluororesin, or silicone resin; aggregate; and a metallic powder, so as to eliminate incident sound waves through conversion to thermal energy.

The structure of the preferred embodiment wave transmission-reception element 10*a* will next be described with reference to FIG. 2.

The wave transmission-reception element 10*a* includes a plurality of unit vibration elements 2 arranged circumferentially in a base member 6*a*. The unit vibration element 2 includes a piezoelectric ceramic piece 3, which is polarized in a direction extending between its front and back faces. A front electrode 4 is formed on the front face of the unit vibration element 2, and a back electrode 5 is formed on the back face of the unit vibration element 2. The electrodes 4 and 5 are exposed at the front and back faces, respectively, of the base member 6*a*. The face of the wave transmission-reception element 10*a* where the front electrode 4 is exposed serves as a wave transmission-reception face.

Figure 2:
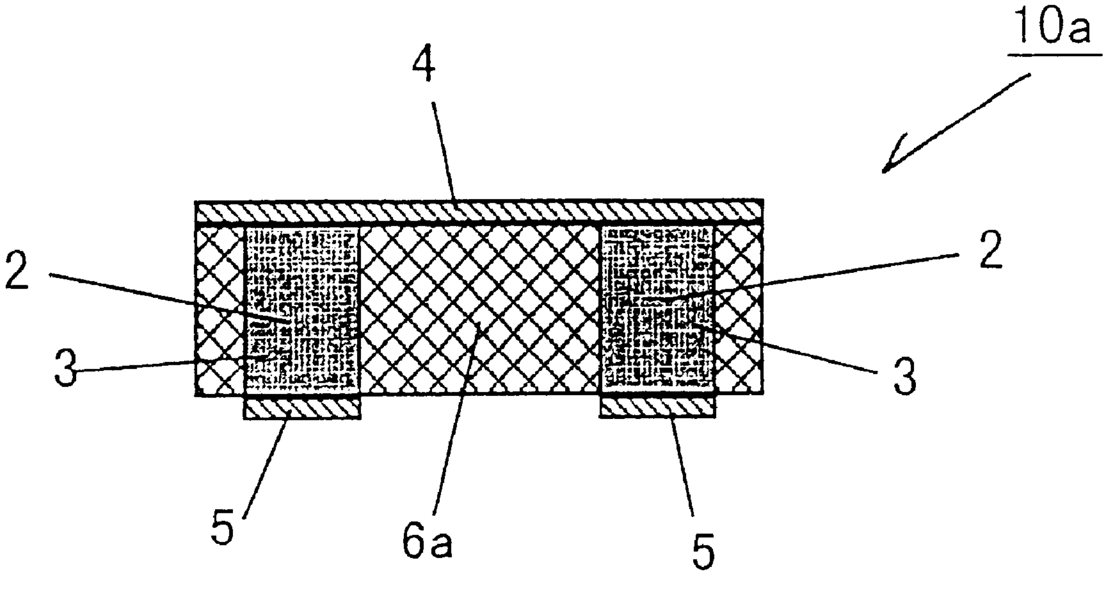
FIG. 2 is a cross-sectional view of the wave transmission-reception element according to the preferred embodiment of the present invention.

As shown in FIG. 2, the front electrode 4 serves as a common electrode for the unit vibration elements 2 and assumes the form of a full-face electrode covering the front face of the wave transmission-reception element 10*a*. The front electrode 4 serves as a grounding electrode. The unit vibration element 2 assumes the form of a short cylinder. The circular back electrode 5 is formed on the back face of the unit vibration element 2.

Figure 3:
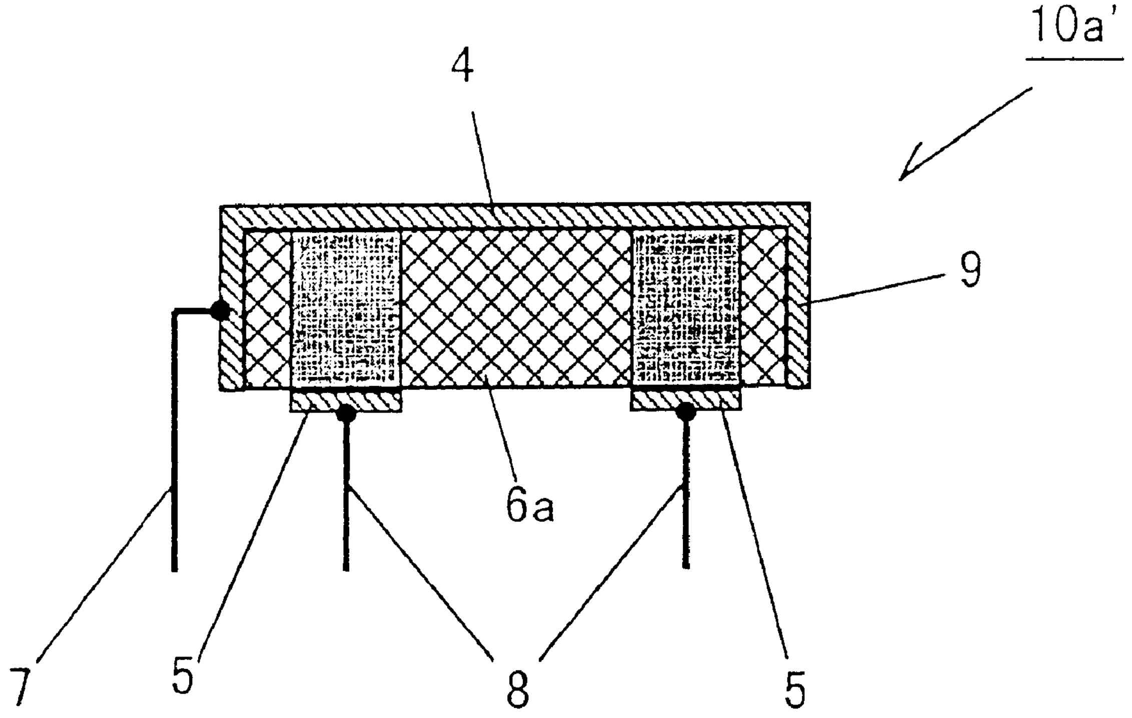
FIG. 3 is a cross-sectional view of a first alternate embodiment of a wave transmission-reception element according to the present invention.

FIG. 3 shows a first alternate embodiment of a wave transmission-reception element 10*a*', which is a modified example of the wave transmission-reception element 10*a*. A connector portion 9 extends from the front electrode 4 onto the cylindrical surface of the wave transmission-reception element 10*a*'. A lead wire 7 is connected to the connector portion 9 and a lead wire 8 is connected to each of the back electrodes 5 so as to establish wiring to the unit vibration elements 2. Employment of the connector portion 9 facilitates connection of the lead wire 7. Notably, in FIGS. 1 and 2, the lead wires 7 and 8 are omitted.

The piezoelectric ceramic piece 3 may assume any of various forms, such as a quadrangular prism, in addition to a cylindrical form. In the case of a form having a noncircular end face, such as a quadrangular prism, partial electrodes formed on the front and back faces may assume circular shapes so as to produce directivity characteristics substantially similar to those of a cylindrical piezoelectric ceramic piece.

Figure 4:
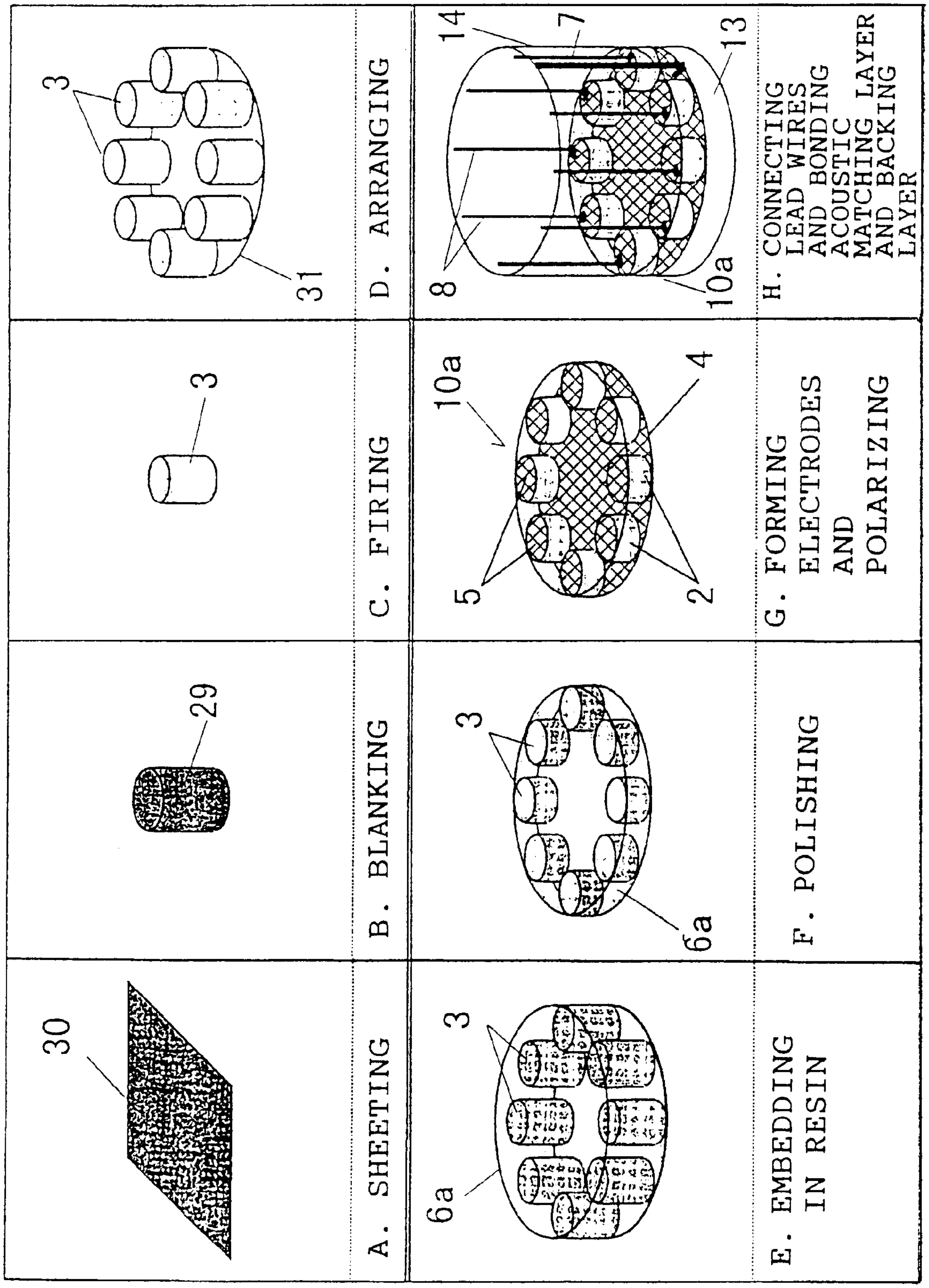
FIG. 4 is a diagram showing a first method for manufacturing the preferred embodiment of the of the wave transmission-reception element according to the present invention.

A first method for manufacturing the preferred embodiment wave transmission-reception element 10*a* will next be described with reference to FIG. 4.

First, in step A, a green ceramic sheet 30 is formed from a piezoelectric ceramic material, such as lead titanate. In step B, ceramic blanks 29 having a short, cylindrical form are blanked out from the ceramic sheet 30 by use of a die. The diameter of the ceramic blank 29 is determined in consideration of shrinkage rate such that the diameter will become 0.1 mm to 2.0 mm after firing. In step C, the ceramic blanks 29 are fired to become piezoelectric ceramic pieces 3. In step D, the piezoelectric ceramic pieces 3 are arranged at equal intervals in a circumferential direction by use of a jig 31.

In step E, the circumferentially arranged piezoelectric ceramic pieces 3 are placed in a molding die, and a material for a base member, such as coldsetting epoxy resin, is poured into the molding die so as to embed the piezoelectric ceramic pieces 3 in the base member 6*a*, thereby yielding a disk element. The hardened disk element is released from the die. In step F, the opposite faces (or one face) of the disk element are polished so as to expose the front and back faces of the piezoelectric ceramic pieces 3 and such that the polished disk element assumes a predetermined thickness. For example, in order to attain a resonance frequency of 5 MHz in thickness longitudinal vibration, the thickness of the disk element is set to about 0.4 mm on the basis of a thickness mode frequency constant of piezoelectric ceramic. In step G, silver paste is applied onto the exposed back faces of the piezoelectric ceramic pieces 3 through screen printing so as to form the corresponding circular back electrodes 5. A full-face electrode is formed on the front face of the disk element, thereby forming the front electrode 4. Further, a direct-current voltage is applied between the electrode 4 and the electrodes 5 for polarization. Notably, the front electrode 4 may be formed on each of the unit vibration elements 2 through screen printing.

In place of screen printing, photolithography may be employed for forming the electrodes 4 and 5.

In step H, the lead wires 7 and 8 are connected to the thus-manufactured wave transmission-reception element 10*a*. Further, the acoustic matching layer 13 is disposed on the front face of the wave transmission-reception element 10*a*, and the backing layer 14 is disposed on the back face of the wave transmission-reception element 10*a*. The short, tubular casing 15 is fitted to the resultant laminate. The flexible tube 16, such as a rubber tube, is fitted to the casing 15, thus yielding the first ultrasound probe 1*a* of FIG. 1.

According to the above-described method, after the piezoelectric ceramic pieces 3 are embedded in the base member 6*a*, formation of electrodes and polarization are performed to thereby yield the wave transmission-reception element 10*a*. However, the piezoelectric ceramic pieces 3 may be individually polished and then subjected to formation of electrodes and polarization, followed by embedment in the base member 6*a* to thereby yield the wave transmission-reception element 10*a*. This alternative method will next be described with reference to FIG. 5.

Figure 5:
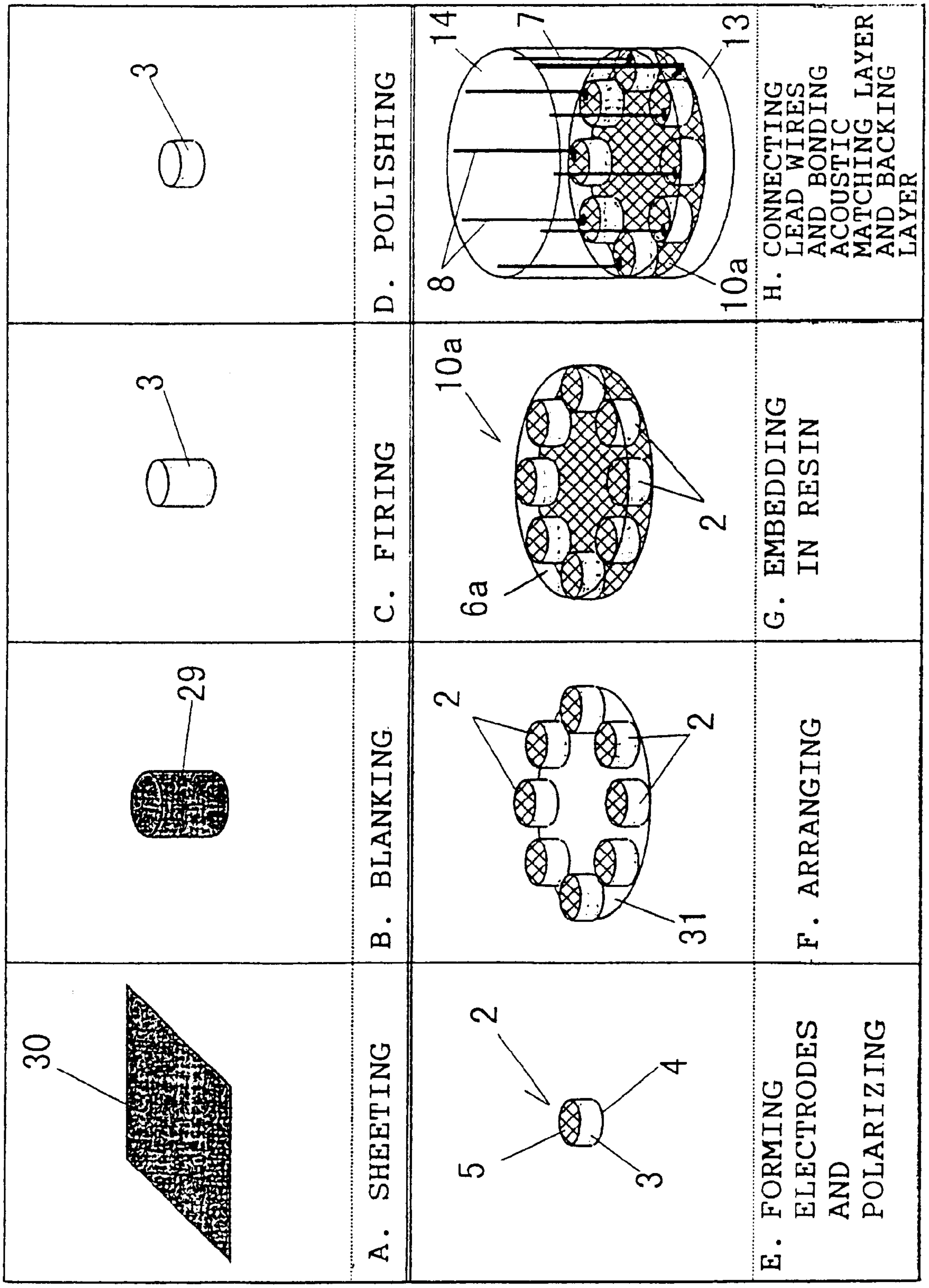
FIG. 5 is a diagram showing a second method for manufacturing the preferred embodiment of the wave transmission-reception element according to the present invention.

In steps A and B of FIG. 5, the short, cylindrical ceramic blanks 29 are obtained. In step C, the ceramic blanks 29 are fired to become the piezoelectric ceramic pieces 3. In step D, each of the piezoelectric ceramic pieces 3 is polished at its opposite faces into a predetermined thickness. In step E, the electrodes 4 and 5 are formed on the polished opposite faces of the piezoelectric ceramic pieces 3, thereby yielding the unit vibration elements 2. In step F, the unit vibration elements 2 are arranged in a circumferential direction by use of the jig 31. In step G, the circumferentially arranged unit vibration elements 2 are placed in a molding die, and a material for a base member is poured into the molding die so as to embed the unit vibration elements 2 in the base member 6*a*, thus yielding the disk-like wave transmission-reception element 10*a*. In step H, assembly work is performed.

Alternatively, the above-described fabrication method may be modified such that after the piezoelectric ceramic pieces 3 are individually subjected to formation of electrodes and polarization and are then embedded in the base member 6*a*, the resultant disk element is polished at its front and back faces and is again be subjected to formation of electrodes, thus yielding the wave transmission-reception element 10*a*. This alternative method will next be described with reference to FIG. 6.

Figure 6:
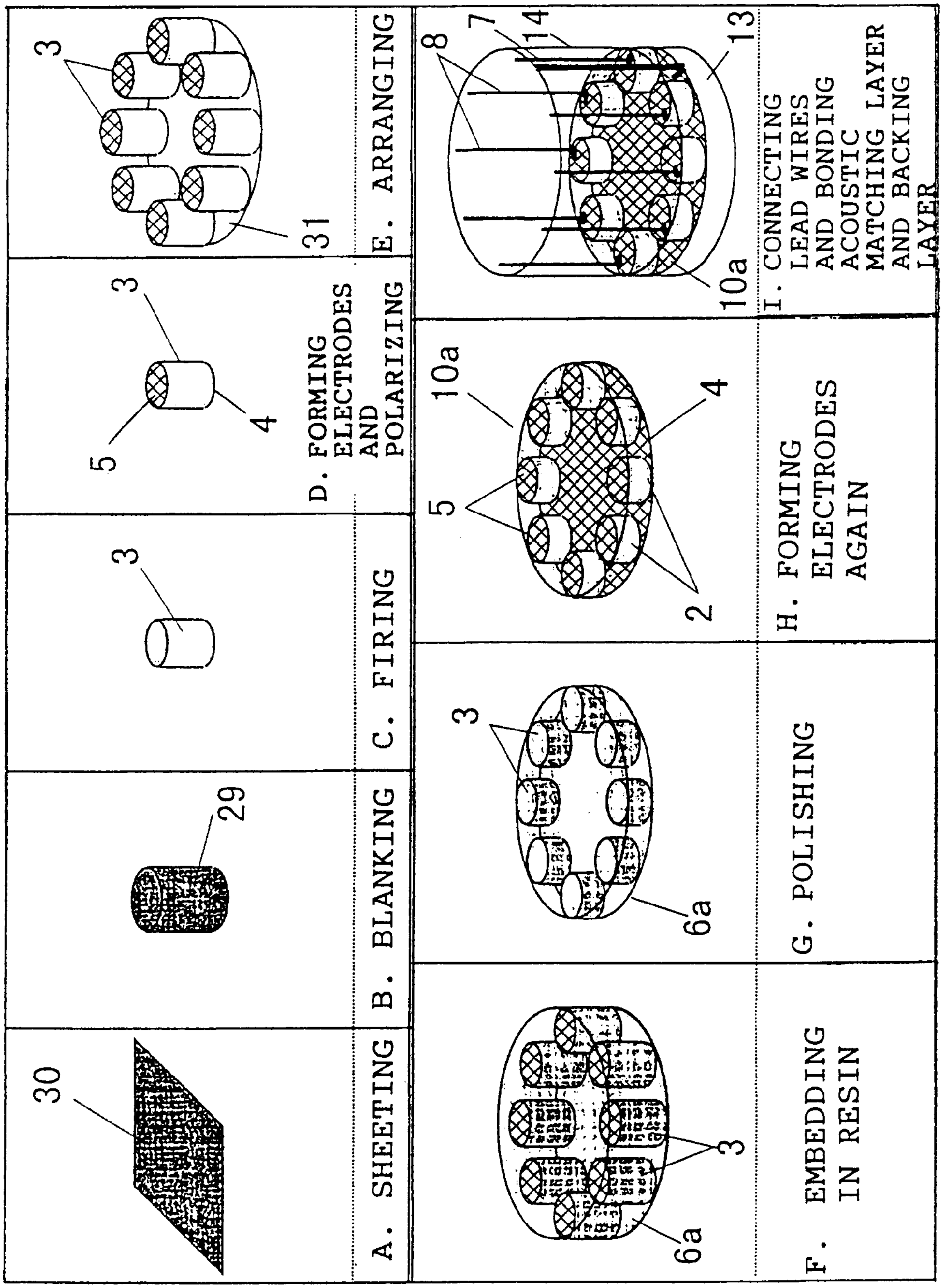
FIG. 6 is a diagram showing a third method for manufacturing the preferred embodiment of the wave transmission-reception element according to the present invention.

In steps A through C of FIG. 6, the piezoelectric ceramic pieces 3 are obtained through firing. In step D, the piezoelectric ceramic pieces 3 are subjected to formation of electrodes on their opposite faces and are then polarized. In step E., the piezoelectric ceramic pieces 3 are arranged in a circumferential direction by use of a jig 31. In step F, the circumferentially arranged piezoelectric ceramic pieces 3 are placed in a molding die, and a material for a base member is poured into the molding die so as to embed the piezoelectric ceramic pieces 3 in the base member 6*a*, thereby yielding a disk element. In step G, the disk element is polished at its opposite faces so as to assume a predetermined thickness. In step H, the electrodes 4 and 5 are again formed on the front and back faces of the unit vibration elements 2, thus yielding the wave transmission-reception element 10*a*. In step 1, assembly work is performed.

In the above-described structures, the front electrode 4 serves as a grounding electrode (full-face electrode, thereby facilitating connection of lead wires. However, the back electrode 5 may serve as a grounding electrode (full-face electrode).

There is no need for the grounding electrode to assume the form of a full-face electrode. The partial electrodes 4 and 5 may be formed on the individual unit vibration elements 2. Employment of the partial electrodes 4 and 5 has advantages in that the same screen can be used in forming the electrodes 4 and 5 and that consumption of expensive silver paste decreases in comparison to employment of a full-face electrode. After the partial electrodes 4 and 5 are formed, inexpensive conductive coating may be applied onto the partial electrodes 4 or 5 so as to form a full-face electrode serving as a grounding electrode.

Figure 7:
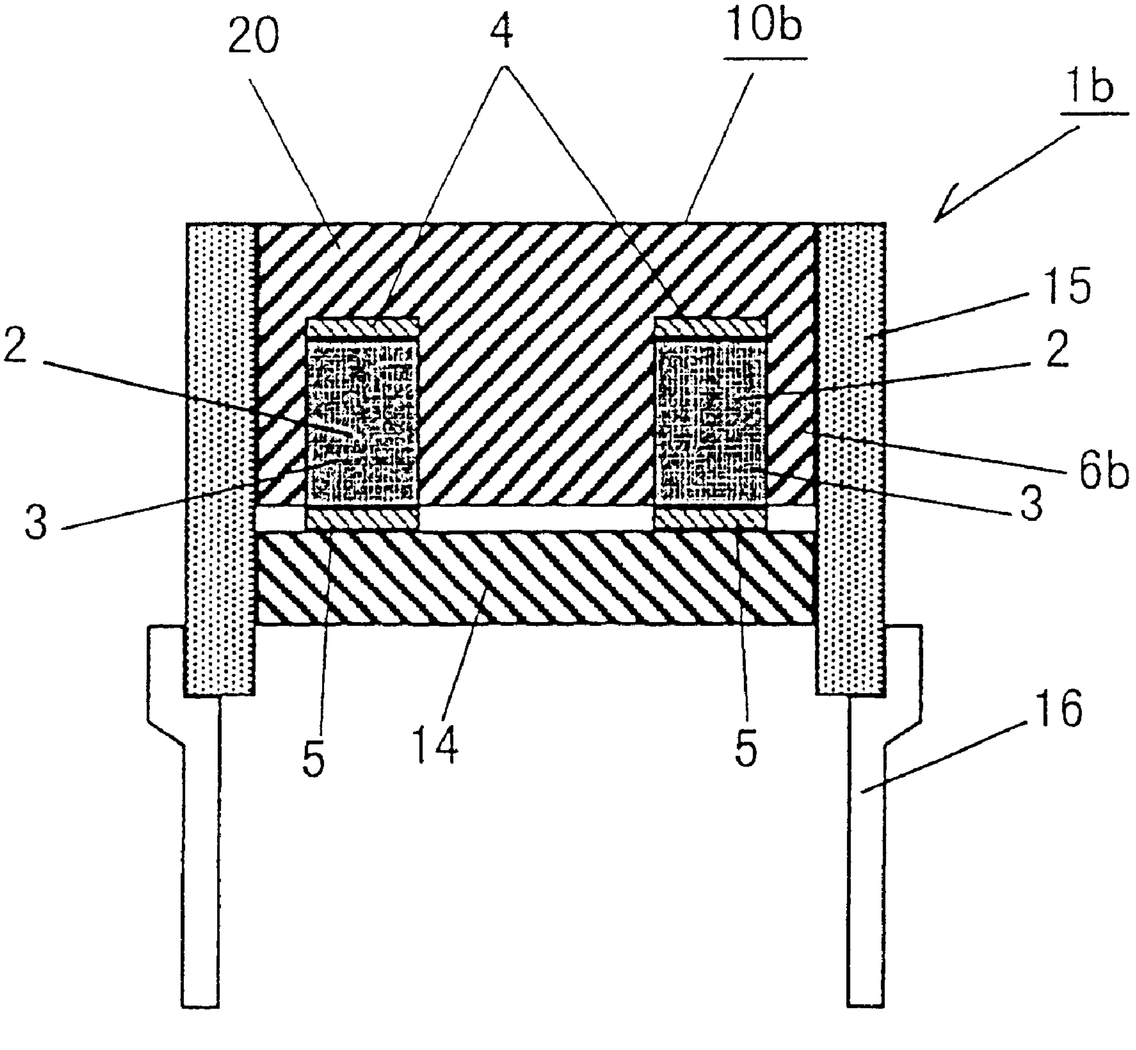
FIG. 7 is a cross-sectional view of a second ultrasound probe equipped with a wave transmission-reception element according to a second alternate embodiment of the present invention.

FIG. 7 shows a second ultrasound probe 1*b* the present invention.

Figure 8:
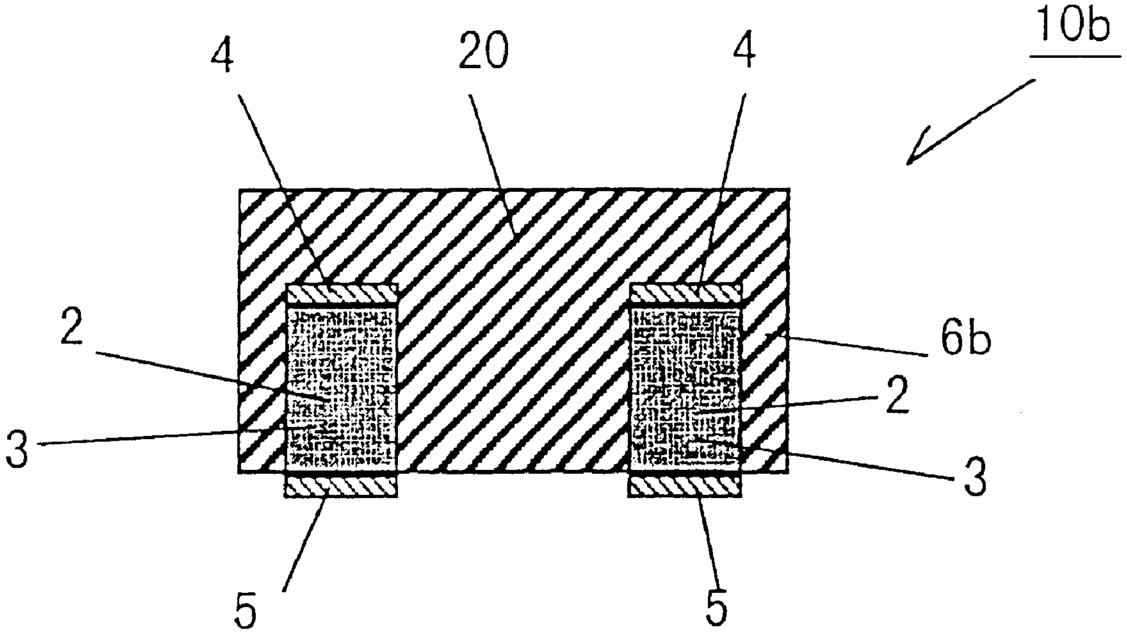
FIG. 8 is a cross-sectional view of the second alternate embodiment of the wave transmission-reception element according to the present invention.

The second ultrasound probe 1*b* includes a second alternate embodiment wave transmission-reception element 10*b* shown in FIG. 8 and includes an acoustic matching portion 20 in place of the above-mentioned acoustic matching layer 13. A backing layer 14 is disposed on the back face of the wave transmission-reception element 10*b*. A short tubular casing 15 is fitted to the resultant laminate. A flexible tube 16, such as a rubber tube, is fitted to the casing 15.

The structure of the wave transmission-reception element 10*b* will next be described with reference to FIG. 8.

As in the case of the wave transmission-reception element 10*a*, the wave transmission-reception element 10*b* includes a plurality of unit vibration elements 2 embedded in a base member (acoustic matching portion) 6*b*. The wave transmission-reception element 10*b* is characterized in that only back electrodes 5 are exposed at its back face, whereas front electrodes 4 are embedded in the base member 6*a* so as not to be exposed.

Specifically, material for the above-mentioned acoustic matching layer 13 is used as the material for the base member 6*b*; i.e., material which matches the acoustic impedance of a medium, such as blood, within which detection is to be performed, is used as the material for the base member 6*b*. An example of such material is epoxy resin. The base member 6*b* thickly covers the front electrodes 4 of the unit vibration elements 2, thereby forming a thick cover portion serving as the acoustic matching portion 20. The acoustic matching portion 20 is of substantially the same thickness as the acoustic matching layer 13. Accordingly, there is no need for forming the acoustic matching layer 13, thereby reducing the number of components of the ultrasound probe 1*b* and thus facilitating the assembly work of the ultrasound probe 1*b*.

Figure 9:
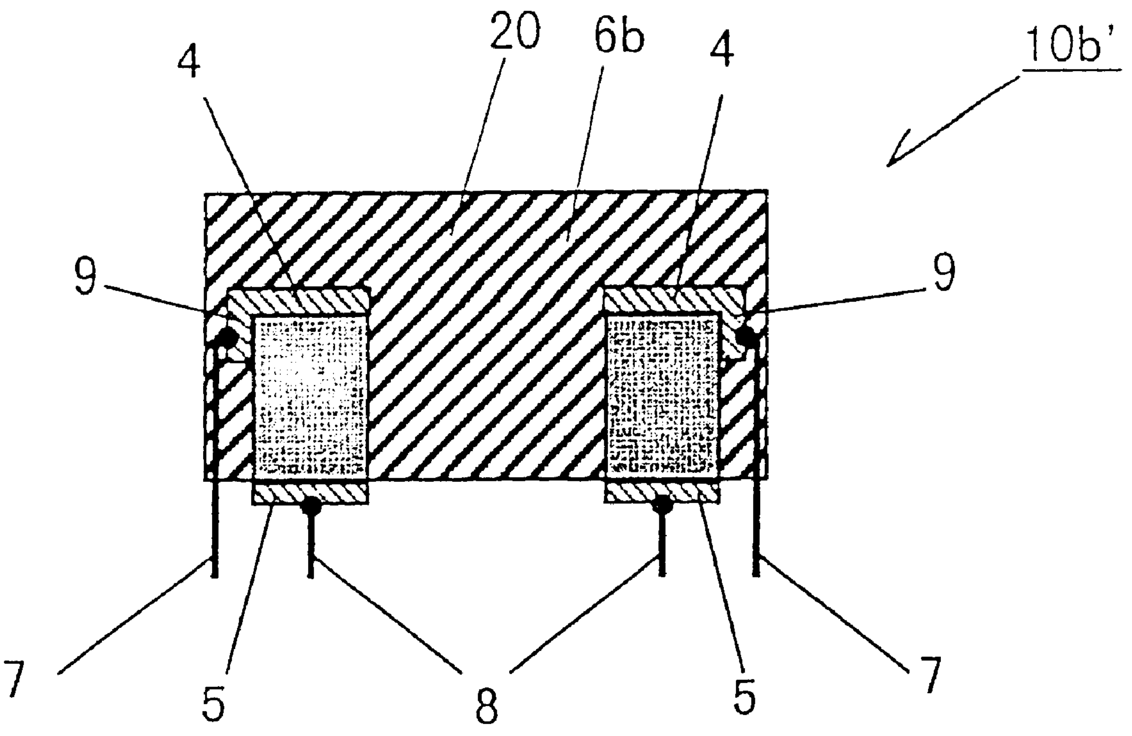
FIG. 9 is a cross-sectional view of a third alternate embodiment of a wave transmission-reception element according to the present invention.

FIG. 9 shows a third alternate embodiment wave transmission-reception element 10*b*', which is a modified example of the second alternate embodiment wave transmission-reception element 10*b*. A connector portion 9 extends from the front electrode 4 onto the cylindrical surface of each of the unit vibration elements 2. A lead wire 7 is connected to the connector portion 9 and is led out from the base member 6*b* and a lead wire 8 is connected to each of the back electrodes 5 so as to establish wiring to the unit vibration elements 2. Notably, in FIGS. 7 and 8, the lead wires 7 and 8 are omitted.

Figure 10:
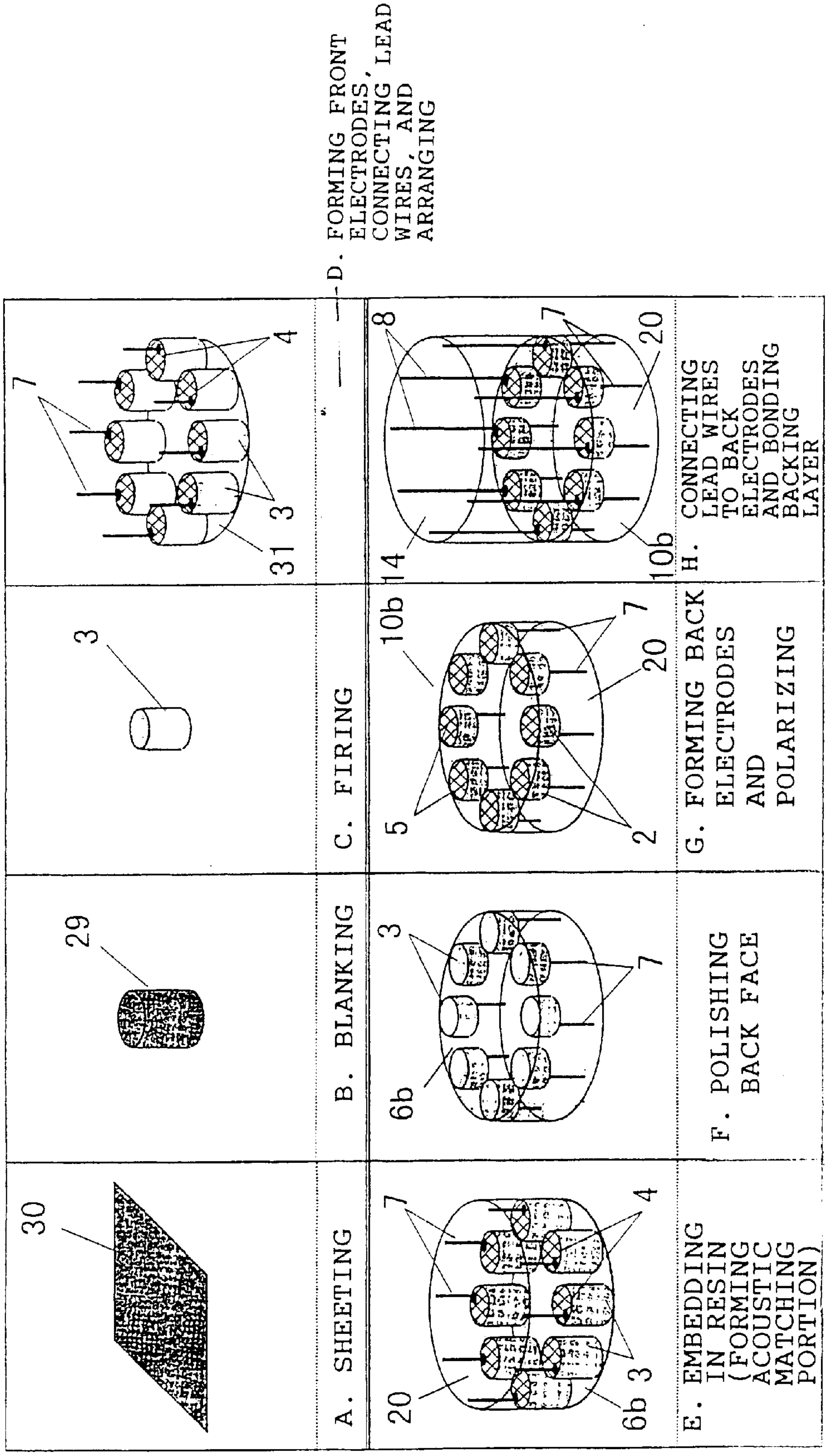
FIG. 10 is a diagram showing a first method for manufacturing the second alternate embodiment of the wave transmission-reception element according to the present invention.

A method for manufacturing the second alternate embodiment wave transmission-reception element 10*b* will next be described with reference to FIG. 10.

Steps A to C for manufacturing the piezoelectric ceramic pieces 3 are similar to those in manufacture of the preferred embodiment wave transmission-reception element 10*a*. In step D, the piezoelectric ceramic pieces 3 are arranged in a circumferential direction by use of a jig 31. The front electrode 4 is formed on one face of each of the piezoelectric ceramic pieces 3 through screen printing. The lead wires 7 are connected to the corresponding front electrodes 4. In step E, the arranged piezoelectric ceramic pieces 3 are placed in a molding die. A material for a base member having good acoustic matching characteristics; for example, epoxy resin, is poured into the molding die so as to embed the piezoelectric ceramic pieces 3 in the base member 6*a*, thereby yielding a disk element. In this case, molding is performed such that the hardened base member 6*b* thickly covers the front electrodes 4 connected to the corresponding lead wires 7 so as to form a thick cover portion serving as the acoustic matching portion 20, while the lead wire 7 are led out from the base member 6*b*.

In step F, only the back face of the disk element is polished so as to expose the back faces of the piezoelectric ceramic pieces 3 at the back face of the base member 6*b* and such that the polished disk element assumes a predetermined thickness. In step G, silver paste is applied onto the exposed back faces of the piezoelectric ceramic pieces 3 through screen printing so as to form the corresponding circular back electrodes 5. Further, a direct-current voltage is applied between the electrodes 4 and 5 for polarization. Thus is yielded the wave transmission-reception element 10*b*.

In step H, lead wires 8 are connected to the corresponding back electrodes 5 of the wave transmission-reception element 10*b*, and then a backing layer 14 is disposed on the back face of the wave transmission-reception element 10*b*. A short tubular casing 15 is fitted to the resultant laminate. A flexible tube 16, such as a rubber tube, is fitted to the casing 15. Thus is completed the ultrasound probe 1*b* of FIG. 9.

Figure 11:
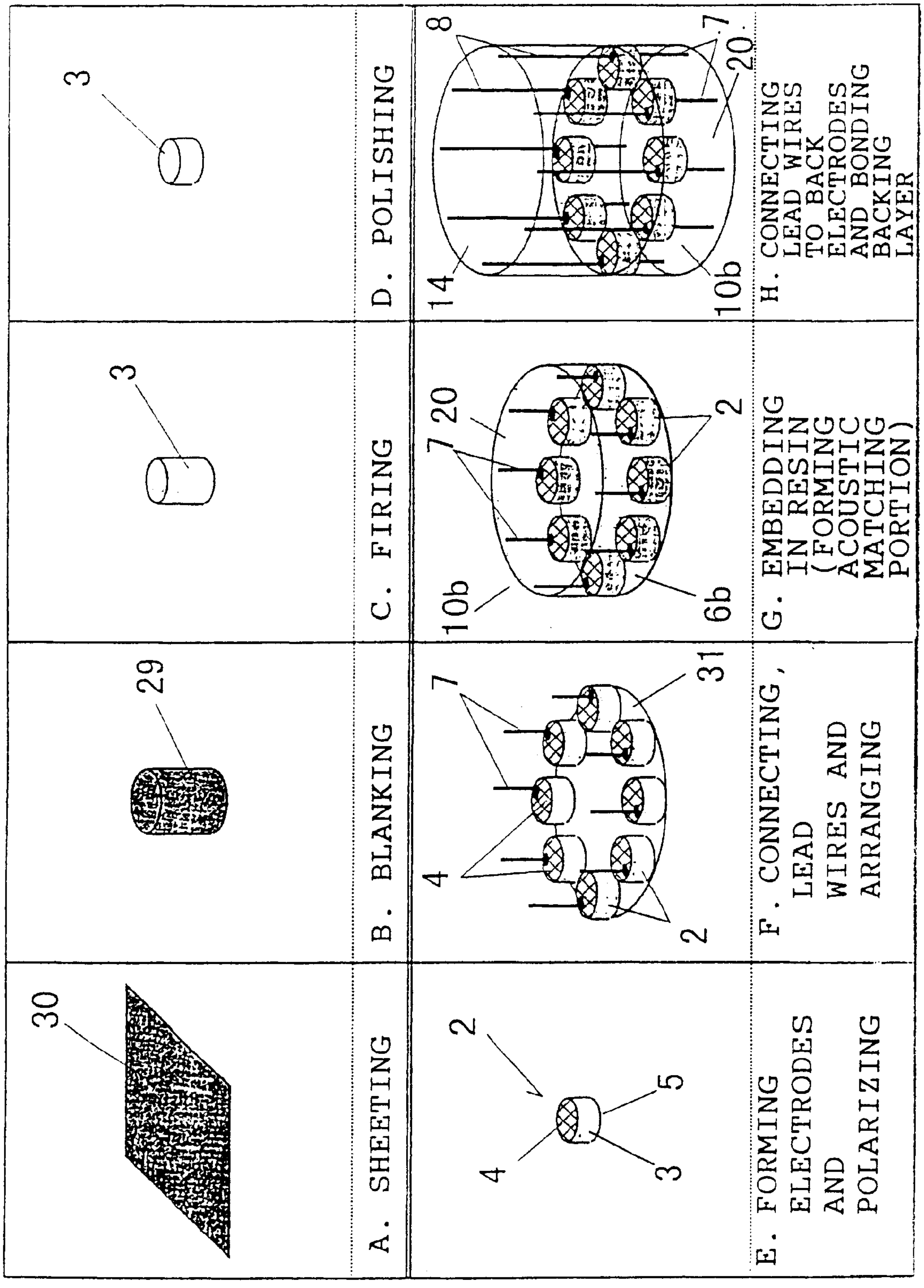
FIG. 11 is a diagram showing a second method for manufacturing the second alternate embodiment of the wave transmission-reception element according to the present invention.

According to the above-described method, after the piezoelectric ceramic pieces 3 are embedded in the base member 6*b*, formation of back electrodes and polarization are performed to thereby yield the wave transmission-reception element 10*b*. However, the above-described fabrication method may be modified such that the piezoelectric ceramic pieces 3 are individually polished and then subjected to formation of electrodes and polarization; the lead wires 7 are then connected to the front electrodes 4, followed by embedment in the base member 6*b* while the lead wires 7 are led out, thereby yielding the wave transmission-reception element 10*b*. This alternative method will next be described with reference to FIG. 11.

In steps A through C, the piezoelectric ceramic pieces 3 are obtained through firing. In step D, each of the piezoelectric ceramic pieces 3 is polished at its opposite faces into a predetermined thickness. In step E, the electrodes 4 and 5 are formed on the polished opposite faces of the piezoelectric ceramic pieces 3, followed by polarization to thereby obtain the unit vibration elements 2. In step F, the unit vibration elements 2 are arranged in a circumferential direction by use of a jig 31, and the lead wires 7 are connected to the corresponding front electrodes 4. In step G, the circumferentially arranged unit vibration elements 2 are placed in a molding die, and a material for a base member, such as epoxy resin, is poured into the molding die so as to embed the unit vibration elements 2 in the base member 6*b*, thus yielding a disk element while the lead wires 7 are led out. In this case, molding is performed such that the hardened base member 6*b* thickly covers the front electrodes 4 connected to the corresponding lead wires 7 so as to form a thick cover portion serving as the acoustic matching portion 20. Thus is completed the wave transmission-reception element 10*b*. In step H, assembly work is performed.

Figure 12:
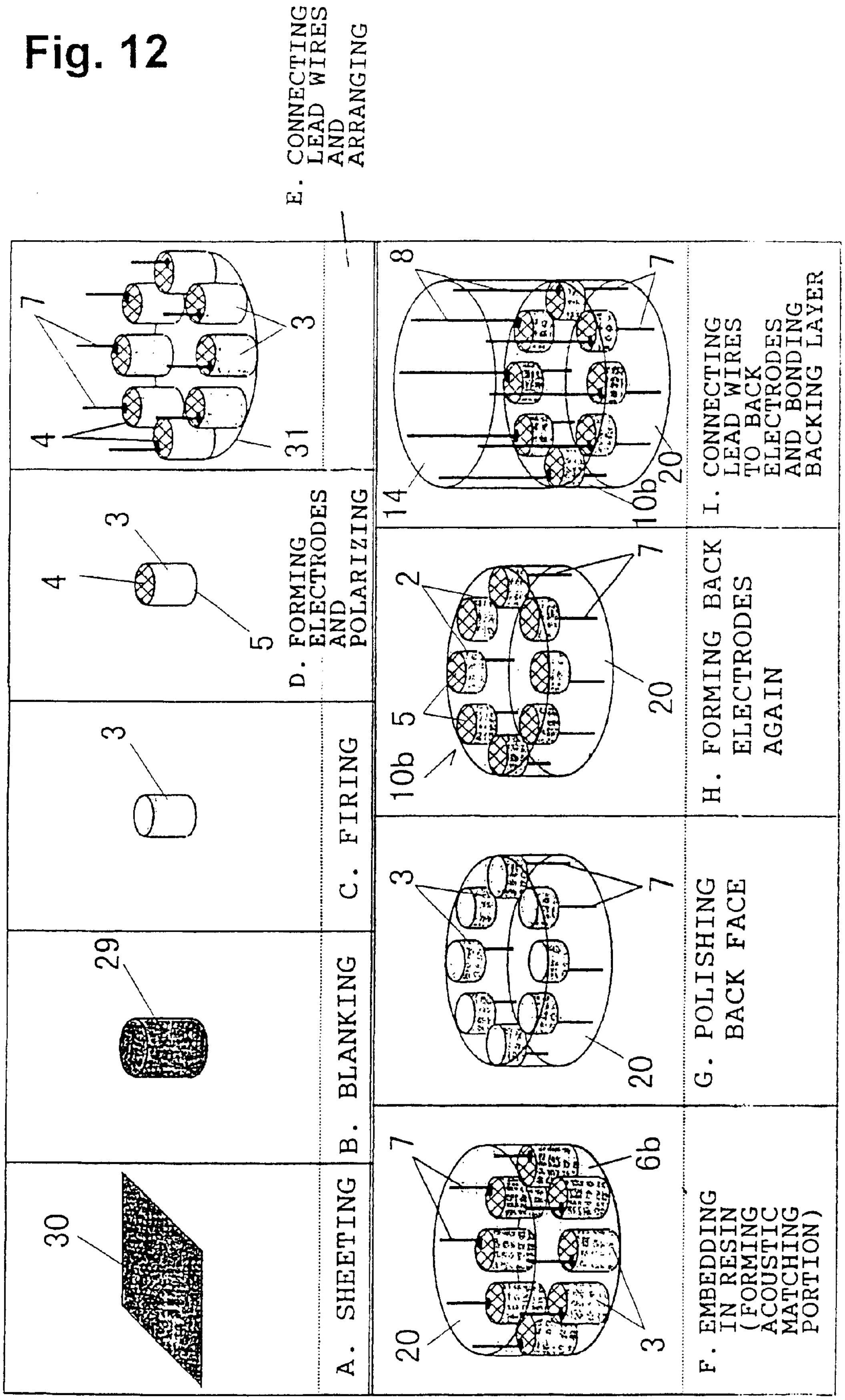
FIG. 12 is a diagram showing a third method for manufacturing the second alternate embodiment of the wave transmission-reception element according to the present invention.

Alternatively, the above-described fabrication method may be modified such that the piezoelectric ceramic pieces 3 are individually subjected to formation of electrodes and polarization; the lead wires 7 are then connected to the corresponding front electrodes 4, followed by embedment in the base member 6*b* while the lead wires 7 are led out; the resultant disk element are polished at its back face; and the back electrodes 5 are again formed, thus yielding the wave transmission-reception element 10*b*. This alternative method will next be described with reference to FIG. 12.

In steps A through C, the piezoelectric ceramic pieces 3 are obtained through firing. In step D, the piezoelectric ceramic pieces 3 are subjected to formation of electrodes on their opposite faces and are then polarized. In step E, the piezoelectric ceramic pieces 3 are arranged in a circumferential direction by use of a jig 31. The lead wires 7 are connected to the corresponding front electrodes 4. In step F, the circumferentially arranged piezoelectric ceramic pieces 3 are placed in a molding die, and a material for a base member is poured into the molding die so as to embed the piezoelectric ceramic pieces 3 in the base member 6*b* while the lead wires 7 are led out, thereby yielding a disk element. In this case, molding is performed such that the hardened base member 6*b* thickly covers the front electrodes 4 so as to form a thick cover portion serving as the acoustic matching portion 20. In step G, the disk element is polished at its back face so as to assume a predetermined thickness. In step H, the back electrodes 5 are again formed on the back faces of the unit vibration elements 2, thereby completing the wave transmission-reception element 10*b*. In step 1, assembly work is performed.

Figure 13:
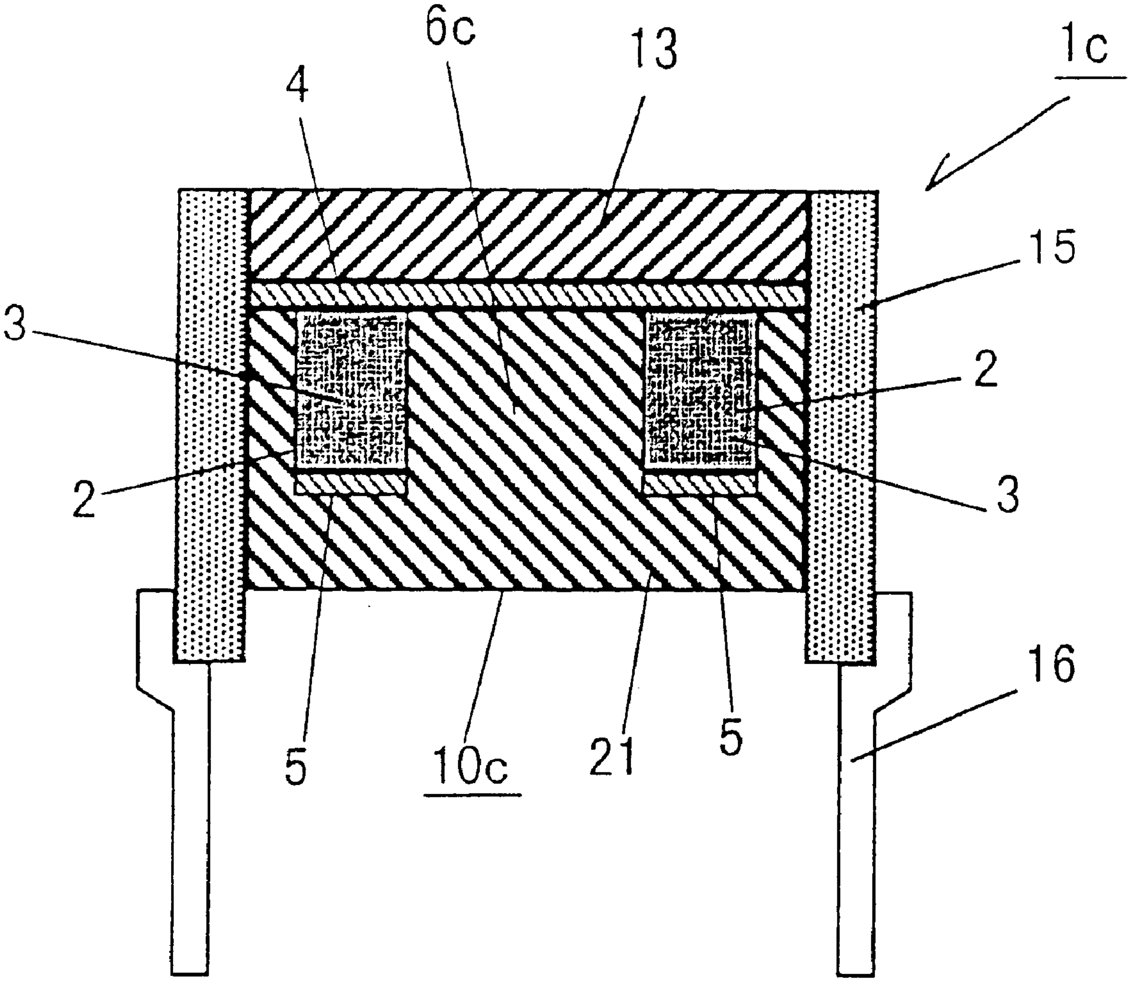
FIG. 13 is a cross-sectional view of a third ultrasound probe equipped with a wave transmission-reception element according to a fourth alternate embodiment of the present invention.

FIG. 13 shows a third ultrasound probe 1*c* according the present invention.

Figure 14:
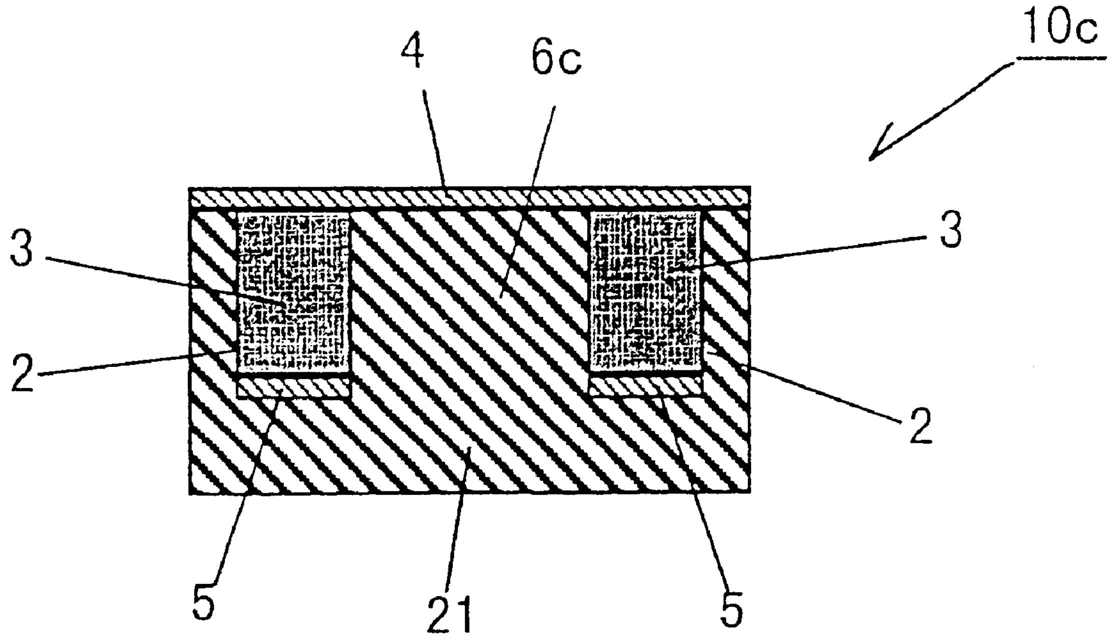
FIG. 14 is a cross-sectional view of the fourth alternate embodiment of the wave transmission-reception element according to the present invention.

The third ultrasound probe 1*c* includes a fourth alternate embodiment wave transmission-reception element 10*c* shown in FIG. 14 and having a backing portion 21 in place of the above-mentioned backing layer 14. An acoustic matching layer 13 is disposed on the front face of the wave transmission-reception element 10*c*. A short tubular casing 15 is fitted to the resultant laminate. A flexible tube 16, such as a rubber tube, is fitted to the casing 15.

The structure of the fourth alternate embodiment wave transmission-reception element 10*c* will next be described.

As shown in FIG. 14, as in the case of the wave transmission-reception elements 10*a* and 10*b*, the fourth alternate embodiment wave transmission-reception element 10*c* includes a plurality of unit vibration elements 2 embedded in a base member 6*c*. Only front electrodes 4 are exposed at the front face of the wave transmission-reception element 10*c*, whereas back electrodes 5 are embedded in the base member 6*c* so as not to be exposed.

Specifically, material for the above-mentioned backing layer 14 is used as the material for the base member 6*c*; i.e., the base member 6*c* is a mixture of a resin material, such as epoxy resin, fluororesin, or silicone resin; aggregate; and a metallic powder, so as to eliminate incident sound waves through conversion to thermal energy. The base member 6*c* thickly covers the back electrodes 5 of the unit vibration elements 2, thereby forming a thick cover portion serving as the backing portion 21. The backing portion 21 is of substantially the same thickness as the backing layer 14. Accordingly, there is no need for forming the backing layer 14, thereby reducing the number of components of the ultrasound probe 1*c* and thus facilitating the assembly work of the ultrasound probe 1*c*.

Figure 15:
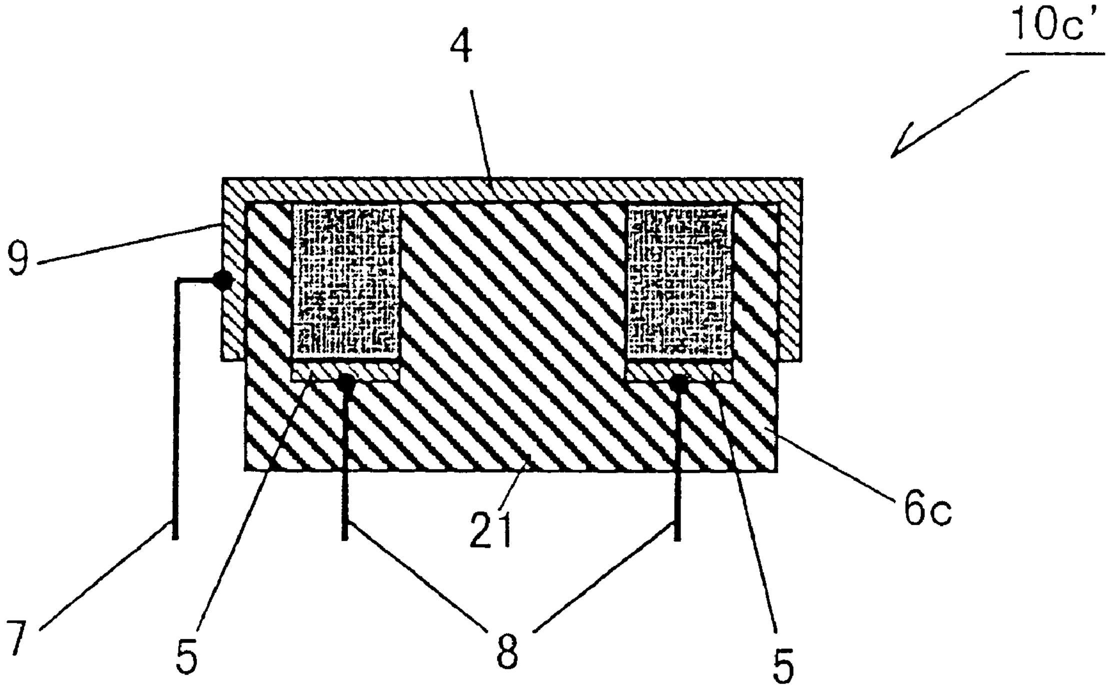
FIG. 15 is a cross-sectional view of a fifth alternate embodiment of a wave transmission-reception element according to the present invention.

FIG. 15 shows a fifth alternate embodiment wave transmission-reception element 10*c*', which is a modified example of the fourth alternate embodiment wave transmission-reception element 10*c*. A connector portion 9 extends from the front electrode 4 onto the cylindrical surface of the wave transmission-reception element 10*c*'. A lead wire 7 is connected to the connector portion 9. Lead wires 8 are connected to the corresponding back electrodes 5 and are led out from the backing portion 21. Wiring to the unit vibration elements 2 are established by means of the lead wires 7 and 8. Employment of the connector portion 9 facilitates connection of the lead wire 7. Notably, in FIGS. 13 and 14, the lead wires 7 and 8 are omitted.

Figure 16:
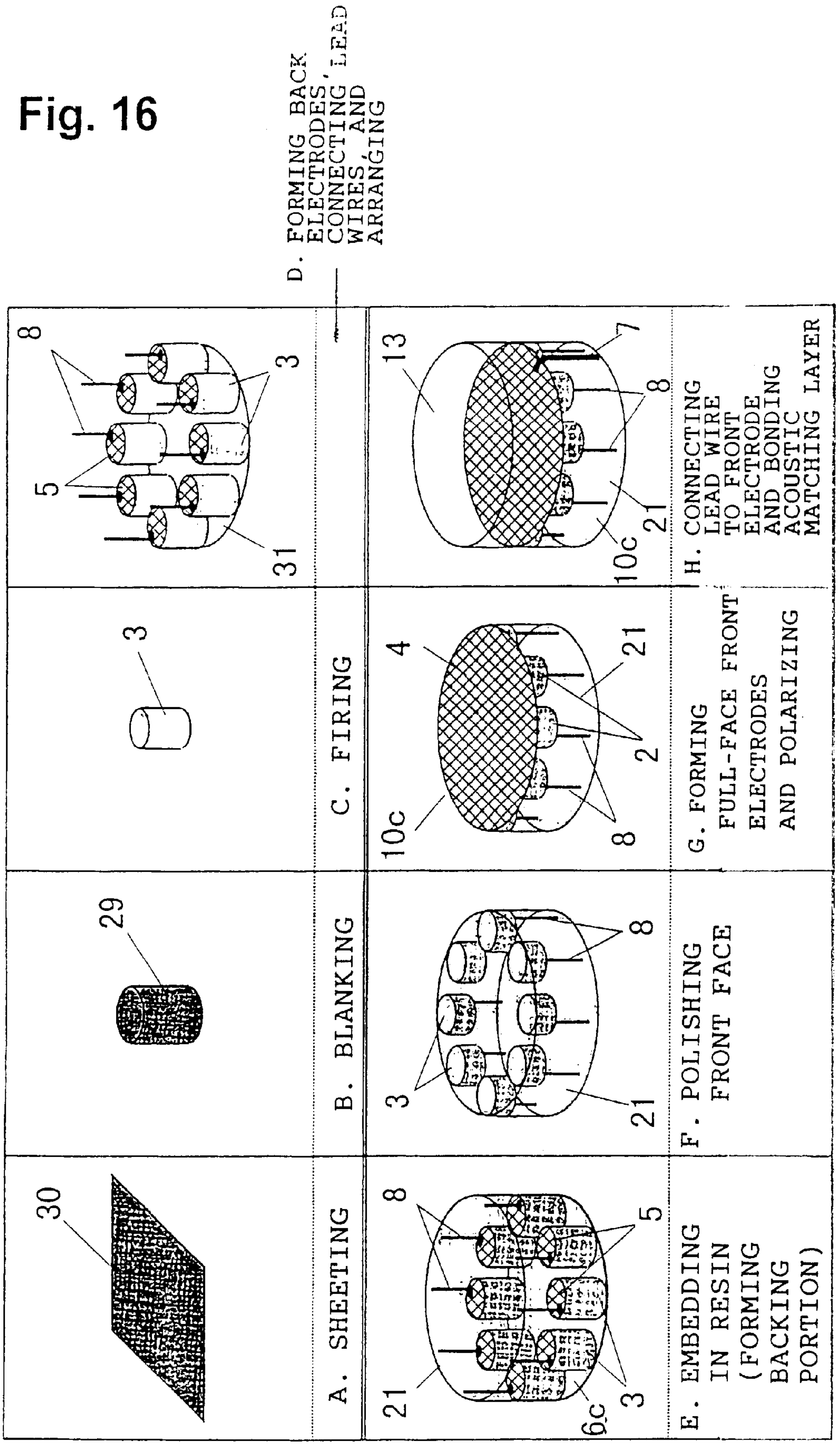
FIG. 16 is a diagram showing a first method for manufacturing the fourth alternate embodiment of the wave transmission-reception element according to the present invention.

A method for manufacturing the fourth alternate embodiment wave transmission-reception element 10*c* having the above structure will next be described with reference to FIG. 16.

As in the case of the wave transmission-reception elements 10*a* and 10*b*, the piezoelectric ceramic pieces 3 are obtained through firing in steps A through C. In step D, the piezoelectric ceramic pieces 3 are orderly arranged by use of a jig. 31. The back electrode 5 is formed on one face of each of the piezoelectric ceramic pieces 3 through screen printing. The lead wires 8 are connected to the corresponding back electrodes 5. In step E, the arranged piezoelectric ceramic pieces 3 are placed in a molding die. A material for a base member having good backing characteristics is poured into the molding die so as to embed the piezoelectric ceramic pieces 3 in the base member 6*c*, thereby yielding a disk element. In this case, molding is performed such that the hardened base member 6*c* thickly covers the back electrodes 5 connected to the corresponding lead wires 8 so as to form a thick cover portion serving as the backing portion 21, while the lead wire 8 are led out from the base member 6*c*.

In step F, only the front face of the disk element is polished so as to expose the front faces of the piezoelectric ceramic pieces 3 at the front face of the base member 6*c* and such that the polished disk element assumes a predetermined thickness. In step G, silver paste is applied onto the front face of the disk element so as to form the full-face electrode 4 of the wave transmission-reception element 10*c*. Alternatively, the circular, partial front electrodes 4 may be formed on the corresponding exposed faces of the piezoelectric ceramic pieces 3. Next, a direct-current voltage is applied through the connected lead wires 7 and 8 between the front electrode 4 and the back electrodes 5 for polarization. Thus is yielded the wave transmission-reception element 10*c*.

In step H, a lead wire 7 is connected to the front electrode 4 of the wave transmission-reception element 10*c*, and then an acoustic matching layer 13 is disposed on the front face of the wave transmission-reception element 10*c*. A short tubular casing 15 is fitted to the resultant laminate. A flexible tube 16, such as a rubber tube, is fitted to the casing 15. Thus is completed the ultrasound probe 1*c* of FIG. 13.

Figure 17:
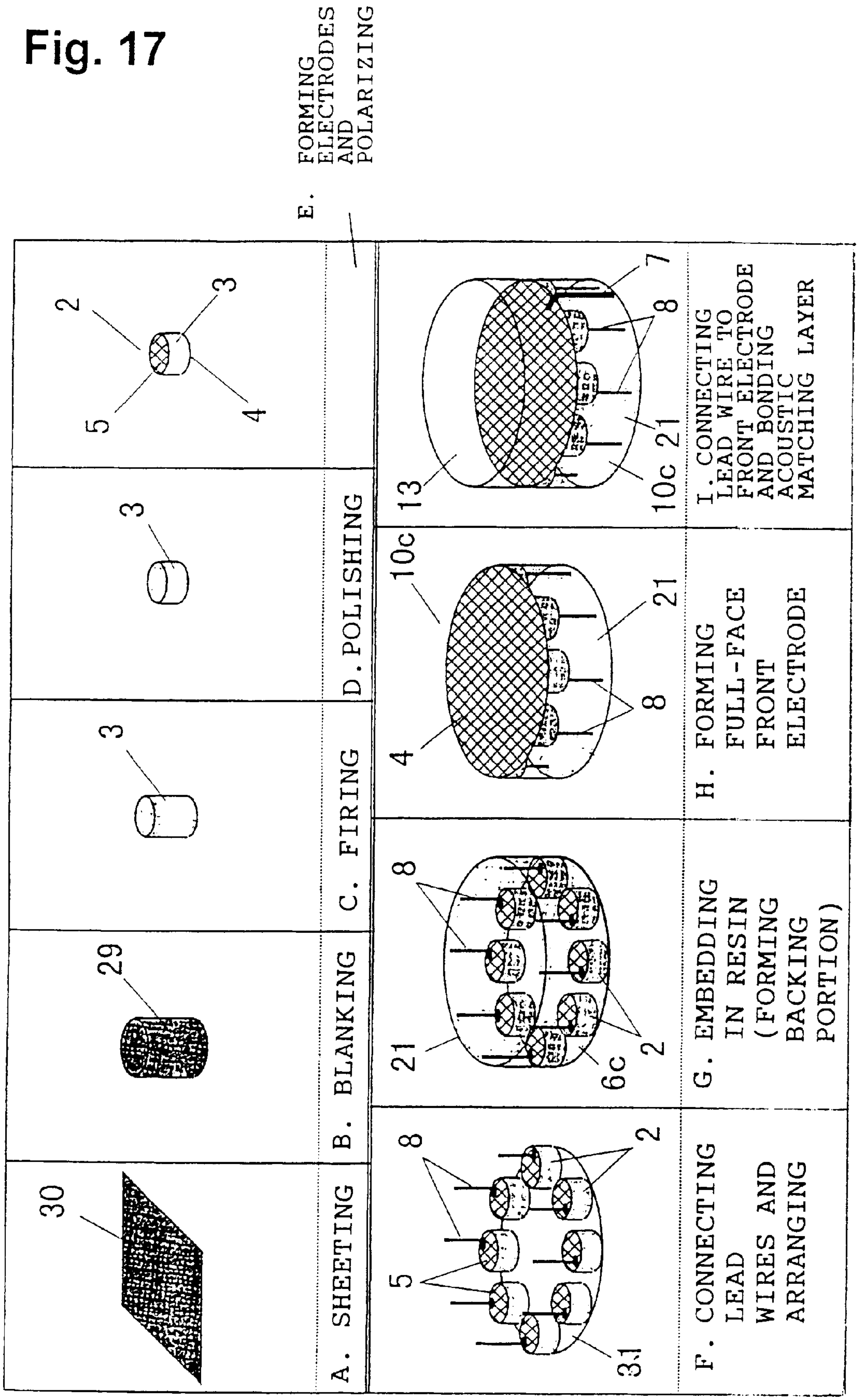
FIG. 17 is a diagram showing a second method for manufacturing the fourth alternate embodiment of the wave transmission-reception element according to the present invention.

According to the above-described method, after the piezoelectric ceramic pieces 3 are embedded in the base member 6*c*, formation of the front electrode and polarization are performed to thereby yield the wave transmission-reception element 10*c*. However, the above-described fabrication method may be modified such that the piezoelectric ceramic pieces 3 are individually polished and then subjected to formation of electrodes and polarization; the lead wires 8 are then connected to the corresponding back electrodes 5, followed by embedment in the base member 6*c* while the lead wires 8 are led out, thereby yielding the wave transmission-reception element 10*c*. This alternative method will next be described with reference to FIG. 17.

In steps A through C, the piezoelectric ceramic pieces 3 are obtained through firing. In step D, each of the piezoelectric ceramic pieces 3 is polished at its opposite faces into a predetermined thickness. In step E, electrodes are formed on the polished opposite faces of the piezoelectric ceramic pieces 3, followed by polarization. In step F, the unit vibration elements 2 are arranged in a circumferential direction by use of a jig 31, and the lead wires 8 are connected to the corresponding back electrodes 5. In step G, the circumferentially arranged unit vibration elements 2 are placed in a molding die, and a material for a base member is poured into the molding die so as to embed the unit vibration elements 2 in the base member 6*b*, thus yielding a disk element while the lead wires 8 are led out. In this case, molding is performed such that the hardened base member 6*c* thickly covers the back electrodes 5 connected to the corresponding lead wires 8 so as to form a thick cover portion serving as the backing portion 21. In step H, the full-face electrode 4 is formed on the front face of the disk element so as to cover the front faces of the unit vibration elements 2. Thus is completed the wave transmission-reception element 10*c*. In step 1, assembly work is performed.

Figure 18:
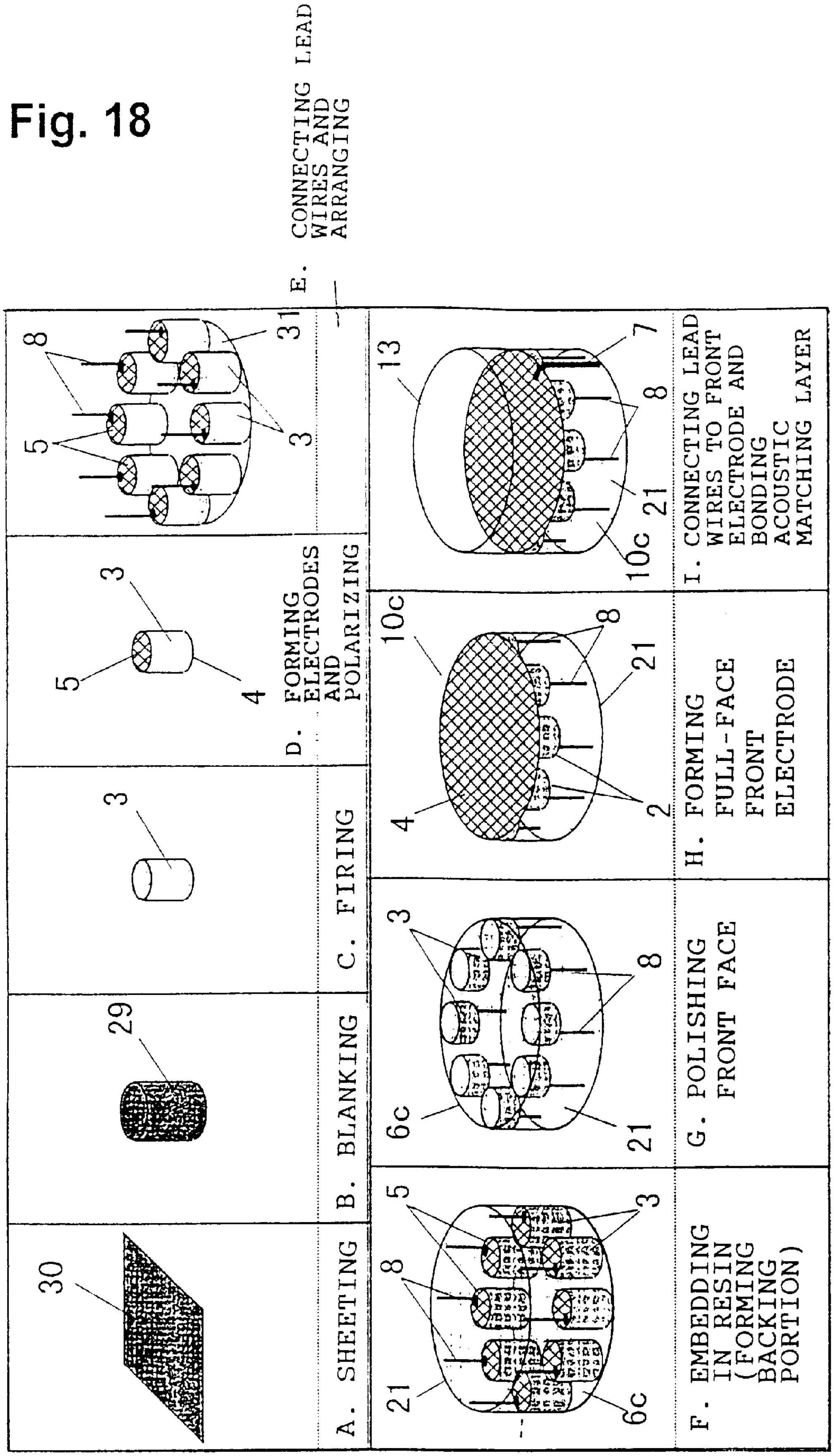
FIG. 18 is a diagram showing a third method for manufacturing the four alternate embodiment of the wave transmission-reception element according to the present invention.

Alternatively, the above-described fabrication method may be modified such that the piezoelectric ceramic pieces 3 are individually subjected to formation of electrodes and polarization; the lead wires 8 are then connected to the corresponding back electrodes 5, followed by embedment in the base member 6*c* while the lead wires 8 are led out; the resultant disk element are polished at its front face; the front electrode 4 is again formed, thus yielding the wave transmission-reception element 10*c*. This alternative method will next be described with reference to FIG. 18.

In steps A through C, the piezoelectric ceramic pieces 3 are obtained through firing. In step D, the piezoelectric ceramic pieces 3 are subjected to formation of electrodes on their opposite faces and are then polarized. In step E, the piezoelectric ceramic pieces 3 are arranged in a circumferential direction by use of a jig 31. The lead wires 8 are connected to the corresponding back electrodes 5. In step F, the circumferentially arranged piezoelectric ceramic pieces 3 are placed in a molding die, and a material for a base member is poured into the molding die so as to embed the piezoelectric ceramic pieces 3 in the base member 6*c* while the lead wires 8 are led out, thereby yielding a disk element. In this case, molding is performed such that the hardened base member 6*c* thickly covers the back electrodes 5 so as to form a thick cover portion serving as the backing portion 21. In step G, the disk element is polished at its front face so as to assume a predetermined thickness. In step H, the front electrode 4 is again formed on the front faces of the unit vibration elements 2, thereby completing the wave transmission-reception element 10*c*. In step I, assembly work is performed.

Characteristics of the above-described ultrasound probes 1*a* to 1*c* will next be discussed.

Angle θ of beam spread indicates an angle at which sound pressure attenuates to half that measured at a center axis. Angle θ of beam spread as measured in a far sound field is approximated by $\sin \theta = 0.704\lambda/d$ (λ:wavelength of sound wave;

d: diameter of sound source)

When the short, cylindrical unit vibration element 2, which is a sound source, has a diameter of 0.3 mm, and wavelength λ is set to 0.3 mm on the basis of an underwater longitudinal-wave velocity being approximately 500 m/s and the element having a resonance frequency of 3 MHz, an angle θ of 44.7° is obtained through calculation using the above expression. The angle of beam spread which was measured underwater by use of a probe scanner was 45°, which is substantially equal to the calculated value.

As mentioned above, the diameter of a sound source is determined by the diameter of the unit vibration element 2.

Through reduction of the diameter of a die used in the above-mentioned step for blanking from the ceramic sheet 30, the diameter of the unit vibration element 2 can be easily reduced. As seen from the above expression, as the diameter of a sound source decreases, the angle of beam spread increases, thereby improving angle-of-beam-spread characteristics.

Figure 21:
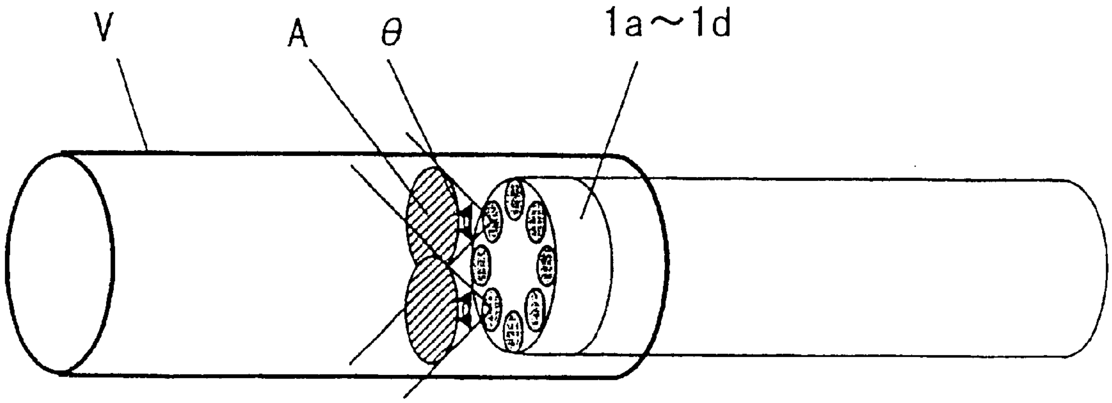
FIG. 21 is a diagrammatic, perspective view showing the angle of beam spread of the ultrasound probe inserted into a blood vessel according to the present invention.
Figure 22:
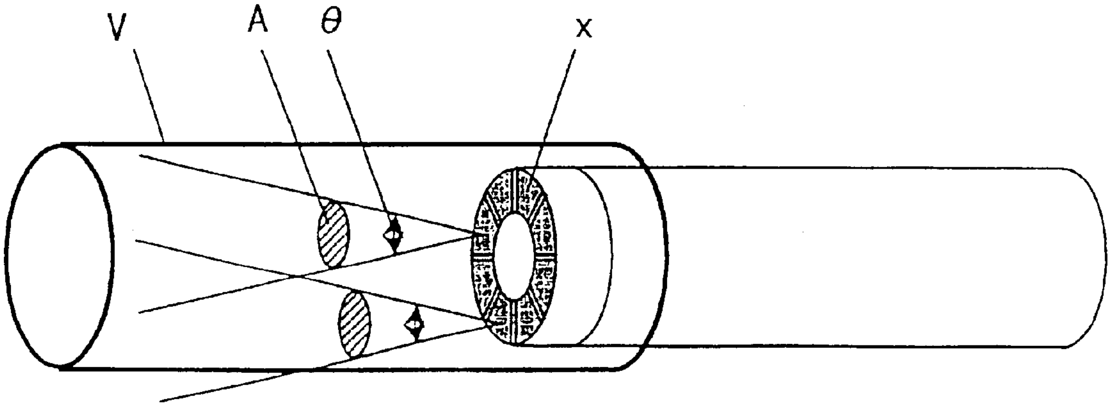
FIG. 22 is a diagrammatic, perspective view showing the angle of beam spread of a conventional ultrasound probe.

As shown in FIG. 21, the ultrasound probe 1*a*(1*b*–1*d*) is inserted deep into a blood vessel V by virtue of the flexibility of the flexible tube 16. One of the unit vibration elements 2 transmits spherical waves forward while the remaining unit vibration elements 2 receive reflections of the spherical waves. The unit vibration elements 2 sequentially take turns transmitting spherical waves. The received reflections of the spherical waves undergo image processing, thereby producing in real time a three-dimensional image of the interior of the blood vessel V. Through reduction of the diameter of the unit vibration element 2, the angle θ of beam spread of spherical waves radiated from each of the unit vibration elements 2 can be easily rendered 45° or greater, whereby range A of visualization can be brought closer to the probe and widened. Since the wave transmitter-receiver portion assumes a circular form, a vibration mode becomes uniform and simple, thereby simplifying signal processing. Accordingly, a three-dimensional image depicting the interior of the blood vessel V becomes wide and clear, thereby facilitating examination and helping a doctor making an appropriate diagnosis.

Figure 19:
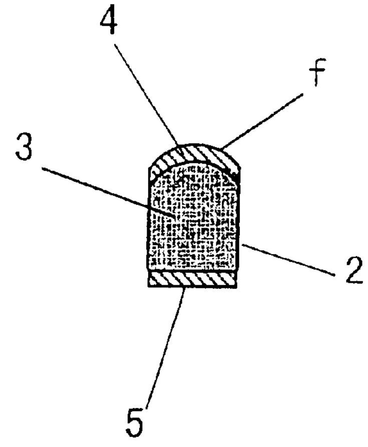
FIG. 19 is a cross-sectional view showing a modified embodiment of a unit vibration element according to the present invention.

Notably, as shown in FIG. 19, the surface of the unit vibration element 2 may assume a spherical surface f so as to effect the action of a convex lens. In this case, through modification of curvature of the spherical surface f, directivity characteristics can be obtained as desired. Alternatively, the surface of the unit vibration element 2 may be concave.

Figure 20:
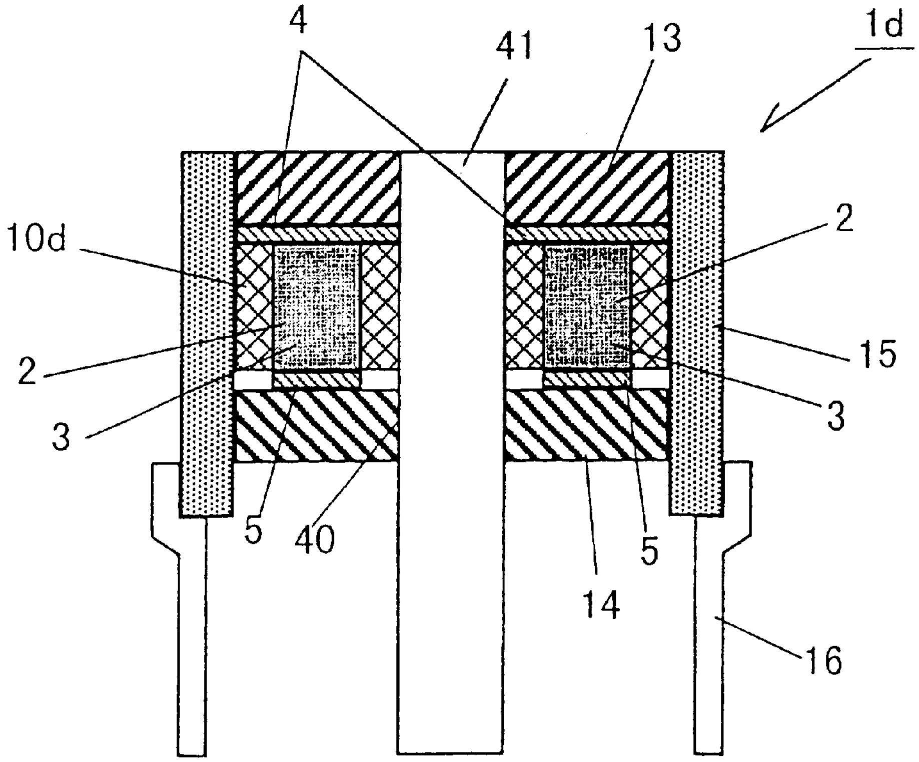
FIG. 20 is a cross-sectional view of a fourth ultrasound probe equipped with a wave transmission-reception element to a sixth alternate embodiment of the present invention.

The ultrasound probe of the present invention enables a doctor to view a three-dimensional image in real time. Thus, for example, he may be able to perform laser ray therapy for affections within the blood vessel V while observing a three-dimensional image of the interior of the blood vessel V. A fourth ultrasound probe 1*d* shown in FIG. 20 may be applied to such therapy. The fourth ultrasound probe 1*d* includes a sixth alternate embodiment annular wave transmission-reception element 10*d*, an annular acoustic matching layer 13, and an annular backing layer 14. Through assembly of these components, a hole 40 is formed so as to accommodate a laser beam path 41, such as an optical fiber. Laser beam is emitted from an end portion of the ultrasound probe 1*d* through the laser beam path 41 so as to, for example, destroy a clot. Thus, the fourth ultrasound probe 1*d* of the present invention can also be used as a therapeutic tool.

In the above-described wave transmission-reception elements 10*a*–10*c*, the unit vibration elements 2 are circumferentially disposed at equal intervals. However, the unit vibration elements 2 may be arranged in any of various ways depending on an object to be detected. For example, the unit vibration elements 2 may be disposed in a row. Even in such an alternative arrangement, the unit vibration elements 2 are held in place by means of base member without need of any complex holding means. That is, the unit vibration elements 2 can be held in any form.

According to the present invention, a wave transmission-reception element for use in an ultrasound probe includes a base member and a plurality of unit vibration elements embedded in the base member. Each of the unit vibration elements includes a piezoelectric ceramic piece having a front face and a back face and polarized in a direction extending between the front and back faces, a front electrode formed on the front face of the piezoelectric ceramic piece, and a back electrode formed on the back face of the piezoelectric ceramic piece. Thus, the unit vibration elements are uniformly held in place without involvement of an increase in the thickness of the wave transmission-reception element, so that the wave transmission-reception element can be miniaturized.

In contrast to conventional means in which an annular ceramic piece is divided into sections serving as unit vibration elements, the present invention yields the following effects: unit vibration elements can be of fine, uniform shape; the angle of beam spread can be increased; spherical waves can be produced; the range of visualization is widened; and a vibration mode is simplified to thereby facilitate signal processing.

The unit vibration elements are disposed, for example, in a circumferential direction. One of the unit vibration elements transmits spherical waves forward while the remaining unit vibration elements receive reflections of the spherical waves. The unit vibration elements sequentially take turns transmitting spherical waves, thereby producing a three-dimensional image.

The manufacturing method of the present invention includes the steps of: blanking piezoelectric ceramic pieces from a sheet; orderly arranging the piezoelectric ceramic pieces in a die; pouring into the die a material for a base member, such as resin, so as to obtain the base member which holds the arranged piezoelectric ceramic pieces in place; polishing the resultant body at its opposite faces; and subjecting the polished element to formation of electrodes and polarization. This method yields the following effects: fine unit vibration elements can be easily formed through blanking from a sheet, thereby facilitating manufacture of the wave transmission-reception element; the wave transmission-reception element can assume a desired thickness through polishing of the base member, thereby facilitating manufacture of the wave transmission-reception element having required characteristics; and the angle of beam spread can be expanded by rendering unit vibration elements fine.

In the case of the wave transmission-reception element characterized in that a plurality of unit vibration elements are embedded in a base member, such as resin, capable of matching an acoustic impedance of a medium, such as blood, within which detection is to be performed; the base member thickly covers the front electrodes of the unit vibration elements so as to form a thick cover portion; and the thick cover portion of the base member serves as an acoustic matching portion, yielded is the following effect: only a backing layer is required to attach to the back face of the wave transmission-reception element in manufacture of an ultrasound probe. Thus, the number of components of the ultrasound probe is reduced, thereby facilitating assembly work.

Similarly, in the case of the wave transmission-reception element characterized in that a plurality of unit vibration elements are embedded in a base member formed of a material, such as resin, capable of blocking transmission of incident sound waves; the base member thickly covers the back electrodes of the unit vibration elements so as to form a thick cover portion; and the thick cover portion of the base member serves as a backing portion, yielded is the following effect: only an acoustic matching layer is required to attach to the front face of the wave transmission-reception element in manufacture of an ultrasound probe. Thus, the number of components of the ultrasound probe is reduced, thereby facilitating assembly work.

The wave transmission-reception element in which a portion of the base member serves as the acoustic matching portion or the backing portion can be easily manufactured by the steps of: forming piezoelectric ceramic pieces through blanking from a sheet followed by firing; forming an electrode on one face of each of the piezoelectric ceramic pieces; connecting lead wires to the corresponding electrodes; embedding the piezoelectric ceramic pieces in a base member formed of a material, such as resin, in such a manner as to thickly cover the electrodes with the base member; polishing a face of the resultant body so as to expose the other faces of the piezoelectric ceramic pieces; and forming an electrode on the exposed faces of the piezoelectric ceramic pieces.

Through formation of a laser beam path at the center of the wave transmission-reception element described above, yielded is the following effect: an ultrasound probe using the wave transmission-reception element can locate, for example, a clot and can destroy it through emission of a laser beam.

In an ultrasound probe using the above-described wave transmission-reception element, the unit vibration elements embedded in the base member are adapted to transmit/receive sound waves. Thus, spherical waves having a large angle of beam spread can be transmitted forward, whereby the range of visualization can be brought closer to the probe and widened. Further, since a vibration mode becomes uniform and simple, signal processing becomes simple. Accordingly, information regarding wide, clear three-dimensional ultrasonogram can be obtained. For example, in application to examination of the interior of a blood vessel, a three-dimensional image of the interior of the blood vessel can be obtained in real time, thereby improving accuracy of ultrasound diagnosis. Application of the ultrasound probe of the present invention is not limited to ultrasound diagnosis. The ultrasound probe may be applicable to various other fields; for example, inspection of piping for cracks.

We claim:

1. A wave transmission-reception element for an ultrasound probe, comprising a base member and a plurality of unit vibration elements embedded in the base member, each of the unit vibration elements comprising a piezoelectric ceramic piece polarized in a direction extending between its front and back faces, a front electrode formed on the front face of the piezoelectric ceramic piece, a back electrode formed on the back face of the piezoelectric ceramic piece and a backing layer bonded to a back face of the wave transmission-reception element, the front or back electrodes being integrated into a common electrode covering all of the piezoelectric ceramic pieces and the common electrode serving a grounding electrode.

2. The wave transmission-reception element for use in an ultrasound probe as described in claim 1, wherein the plurality of unit vibration elements are embedded in the base member such that each of the electrodes is exposed at the front or back face of the base member.

3. The wave transmission-reception element for use in an ultrasound probe as described in claim 2, further including an acoustic matching layer bonded to a front face of the wave transmission-reception element, and a backing layer bonded to a back face of the wave transmission-reception element.

4. The wave transmission-reception element for use in an ultrasound probe as described in claim 3, characterized in that a laser beam path is formed at a center of the wave transmission-reception element.

5. The wave transmission-reception element for use in an ultrasound probe as described in claim 1, characterized in that the base member in which the plurality of unit vibration elements are embedded is formed of a material capable of matching an acoustic impedance of a medium, such as blood, within which detection is to be performed; the base member covers the front electrodes of the unit vibration elements so as to form a cover portion; and the cover portion of the base member serves as an acoustic matching portion.

6. The wave transmission-reception element for use in an ultrasound probe as described in claim 5, characterized in that a laser beam path is formed at a center of the wave transmission-reception element.

7. The wave transmission-reception element for use in an ultrasound probe as described in claim 1, characterized in that the plurality of unit vibration elements are embedded in the base member capable of blocking transmission of incident sound waves; the base member thickly covers the back electrodes of the unit vibration elements so as to form a thick cover portion; and the thick cover portion of the base member serves as a backing portion.

8. The wave transmission-reception element for use as an ultrasound probe as described in claim 7, further including an acoustic matching layer bonded to a front face of the wave transmission-reception element.

9. The wave transmission-reception element for use in an ultrasound probe as described in claim 8, characterized in that a laser beam path is formed at a center of the wave transmission-reception element.

* * * * *